(12) United States Patent
Kawabata et al.

(10) Patent No.: US 8,050,651 B2
(45) Date of Patent: Nov. 1, 2011

(54) DETECTOR, RF CIRCUIT WITH DETECTOR, AND MOBILE DEVICE WITH RF CIRCUIT

(75) Inventors: Sumi Kawabata, Tokyo (JP); Norihisa Yamamoto, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 449 days.

(21) Appl. No.: 12/365,763

(22) Filed: Feb. 4, 2009

(65) Prior Publication Data

US 2009/0203315 A1  Aug. 13, 2009

(30) Foreign Application Priority Data

Feb. 8, 2008 (JP) .................................. 2008-028639
Nov. 28, 2008 (JP) .................................. 2008-304104

(51) Int. Cl.
*H04W 4/00* (2009.01)
*H04B 5/00* (2006.01)

(52) U.S. Cl. ..................... 455/343.5; 455/41.1; 455/41.2
(58) Field of Classification Search ............... 455/343.5, 455/41.1–41.2
See application file for complete search history.

(56) References Cited

U.S. PATENT DOCUMENTS

| | | | | |
|---|---|---|---|---|
| 4,595,972 A | * | 6/1986 | Davis et al. ..................... | 363/15 |
| 4,977,611 A | * | 12/1990 | Maru ........................ | 455/161.2 |
| 5,479,160 A | * | 12/1995 | Koelle ........................ | 340/10.4 |
| 5,694,420 A | * | 12/1997 | Ohki et al. .................... | 375/222 |
| 5,797,090 A | * | 8/1998 | Nakamura ................. | 455/234.1 |
| 6,823,191 B2 | * | 11/2004 | Laroia et al. .................. | 455/458 |
| 7,027,796 B1 | * | 4/2006 | Linsky et al. .............. | 455/343.1 |

FOREIGN PATENT DOCUMENTS

JP   2006-099810 A   4/2006

OTHER PUBLICATIONS

Chaoming Zhang, "Built-In Test of RF Mixers Using RF Amplitude Detectors," 2007 IEEE Proceedings of the 8th International Symposium on Quality Electronic Design, Mar. 26-28, 2007, pp. 404-409.

* cited by examiner

*Primary Examiner* — Shawki Ismail
*Assistant Examiner* — Matthew C Tabler
(74) *Attorney, Agent, or Firm* — Miles & Stockbridge P.C.

(57) ABSTRACT

The detector is reduced in DC power consumption when an input signal is at a low amplitude level. The detector includes first and second input terminals, first and second transistors, and a load element. The first and second input terminals are supplied with complementary input signals reverse to each other in phase. The first input terminal is connected to the first input electrode of the first transistor and the second input electrode of the second transistor. The second input terminal is connected to the second input electrode of the first transistor and the first input electrode of the second transistor. The load element is connected between output electrodes of the transistors and an operating voltage point. A detection voltage resulting from full-wave rectification arises from a circuit node. In the condition where a signal input to the input terminals is at a low amplitude level, the transistors are both in OFF state. Thus, DC power consumption is reduced.

23 Claims, 9 Drawing Sheets

Fig.10A
Fig.10B
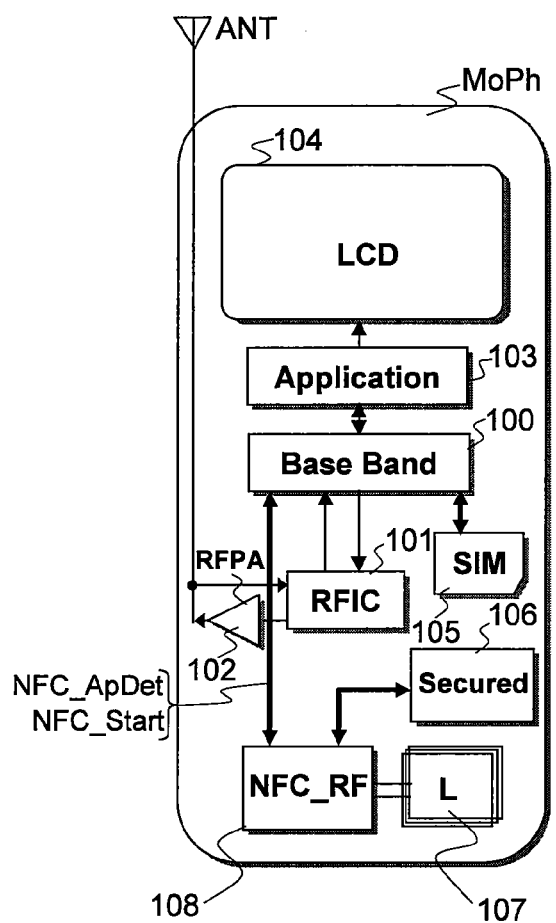
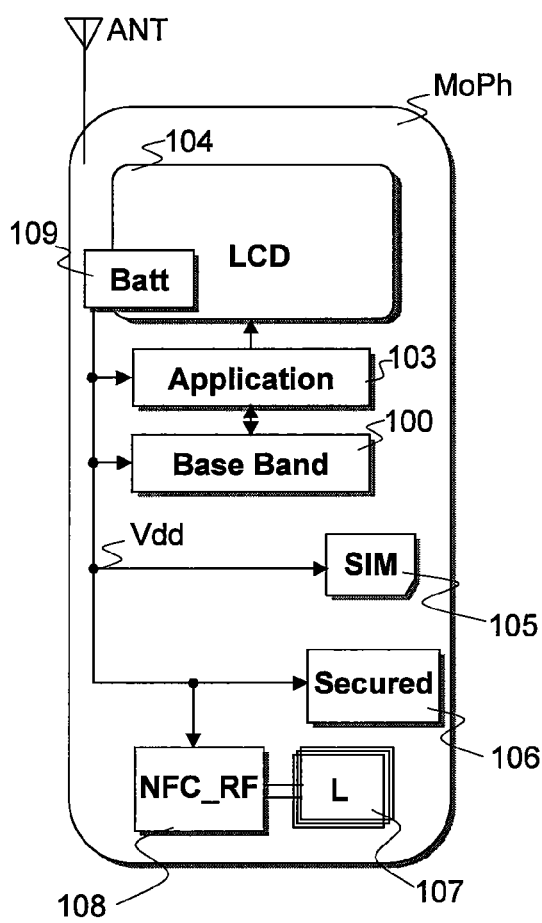

DETECTOR, RF CIRCUIT WITH DETECTOR, AND MOBILE DEVICE WITH RF CIRCUIT

CLAIM OF PRIORITY

The Present application claims priority from Japanese applications JP 2008-28639 filed on Feb. 8, 2008 and JP 2008-304104 filed on Nov. 28, 2008, the content of which is hereby incorporated by reference into this application.

FIELD OF THE INVENTION

The present invention relates to a detector and an RF circuit with the detector, and a mobile device with the RF circuit. Particularly, it relates to a technique beneficial to provide a detector which is reduced in DC power consumption in a condition where an input signal is at a low amplitude level.

BACKGROUND OF THE INVENTION

According to Chaoming Zhang et al, "Built-In Test of RF Mixers Using RF Amplitude Detectors", 2007 IEEE Proceedings of the 8th International Symposium on Quality Electronic Design, 26-28 Mar. 2007, PP. 404~409, it is disclosed, as the way of reducing manufacturing test time of an RF circuit built in SoC (System on Chip) or SiP (System in Package) and the cost thereof, to connect an input terminal of an RF detector with an output of an RF mixer.

The RF detector includes a pseudo-differential pair composed of two N-channel MOS transistors to detect an output from the RF mixer. Between the drain and gate of each N-channel MOS transistor, a resistance for biasing a gate voltage of the transistor is connected.

The sources of the two N-channel MOS transistors are connected to the earth potential commonly. The drains of the two N-channel MOS transistors are connected to a P-channel MOS bias current mirror composed commonly. Two capacitances connected to the gates of the two N-channel MOS transistors serve to block DC current which affects a detecting operation. To the drains of the two N-channel MOS transistors, an output capacitance for holding an output voltage is connected.

Further, JP 2006-099810 discloses a sub-carrier detection circuit for detecting the presence or absence of a non-contact IC-card in a read/write device which performs reading from and writing into a non-contact IC-card.

In this sub-carrier detection circuit, when a sub-carrier signal from a coil antenna of a non-contact IC-card is applied to a base of a detection transistor, which has been supplied with a fixed bias voltage resulting from voltage division of a source voltage, a half-wave rectification output signal is formed by a resistance and a capacitance connected in parallel in association with an emitter of the detection transistor.

SUMMARY OF THE INVENTION

In recent years, a communication technology termed NFC (Near Field Communication) technology has been in common use simplifying and spreading household electrical appliances, digital media, consumer-oriented wireless communication connections, contents and business transactions. The NFC technology is compatible with various existing communication systems, and uses an RF frequency of 13.56 MHz to enables near field communication at a communication rate up to 847 kbps for about ten in centimeters. Particularly, a mobile phone terminal with a built-in IC-card microcomputer (Secure-Chip) having an electronic payment function is equipped with the NFC technology, which aims to improve end users' friendliness by putting the NFC technology to good use for various scenes of non-contact electronic payment such as payment for an article to be purchased at a store or shop and payment for a transportation expense at a railroad station by such non-contact manner. Now, it is noted that NFC is an abbreviation for Near Field Communication.

Prior to the invention, the inventors were engaged in the development of an NFC communication RF circuit (RF chip) incorporated in a mobile phone terminal which utilizes NFC communication with a non-contact reader/writer apparatus for non-contact electronic payment. A mobile phone terminal of this type contains an antenna, an RF receive and transmit signals' processing integrated circuit, an RF power amplifier, a baseband processor, an application processor, an SIM card, an IC-card microcomputer, an RF circuit for NFC communication, a coil antenna for NFC communication, a battery, a liquid crystal display device, a speaker, a microphone, and a control key.

The RF receive and transmit signals' processing integrated circuit, RF power amplifier, baseband processor, application processor and SIM card enables RF communication with mobile phone terminals and base stations. A SIM card is a subscriber identification information module having an internal nonvolatile memory, in which information to identify a subscriber who has made a contract with a telephone company operating base stations is stored. Now, it is noted that SIM is an abbreviation for Subscriber Identification Module.

When RF communication is started by use of a control key, a transmit voice signal from a microphone is converted into a transmit digital baseband signal by treatment by an A/D converter in a baseband processor and modulation by a digital signal processor (DSP) according to a software program. The transmit digital baseband signal is converted into a transmit analog baseband signal by a D/A converter of the RF receive and transmit signals' processing integrated circuit (RFIC). The transmit analog baseband signal is converted into an RF transmit signal by a transmit signal processing unit of RFIC. The RF transmit signal is sent to a base station through the RF power amplifier and antenna.

An RF receive signal from a base station is converted into a receive analog baseband signal by the receive signal processing unit of RFIC. The receive analog baseband signal is converted into a receive digital baseband signal by an A/D converter of RFIC. The receive digital baseband signal is converted into a receive voice signal by demodulation by DSP in the baseband processor according to a software program and treatment by a D/A converter. The receive voice signal is supplied to the speaker.

When a mobile phone terminal is put within a range of NFC short-distance communication with a non-contact reader/writer apparatus, the mobile phone terminal becomes ready to receive a carrier signal from the non-contact reader/writer apparatus through the coil antenna for NFC communication thereof. The RF circuit for NFC communication responds to a receive carrier signal from the coil antenna for NFC communication to generate an NFC approach notification signal. The NFC approach notification signal is supplied to the baseband processor.

The baseband processor responds to the NFC approach notification signal to generate a non-contact electronic payment start signal. The non-contact electronic payment start signal is supplied to the RF circuit for NFC communication. In response to the start signal, the RF circuit for NFC communication begins bi-directional data communication with an IC-card microcomputer (Secure-Chip or Secure-Micon), and in parallel, supplying an operation clock signal to the IC-card microcomputer in order to start the non-contact electronic payment. Thus, the IC-card microcomputer starts an electronic payment operation.

The source voltage from the battery of the mobile phone terminal has been supplied to the baseband processor, RF circuit for NFC communication and IC-card microcomputer before start of the electronic payment operation. Before start of the electronic payment operation, the IC-card microcomputer supplied with the source voltage is brought into Standby state (i.e. Sleep state) on the whole. Also, in the baseband processor supplied with the source voltage, a functional block involved in the electronic payment operation is driven into Standby state. Further, in the RF circuit for NFC communication supplied with the source voltage, a circuit other than a carrier detector operable to detect the signal level of a receive carrier signal from the coil antenna for NFC communication is put in Standby state before start of the electronic payment operation. Therefore, the carrier detector of the RF circuit for NFC communication is activated even before start of the electronic payment operation, and keeps monitoring the signal level of a receive carrier signal from the coil antenna for NFC communication. The signal level of a receive carrier signal at or above an input threshold voltage of the detection transistor of the carrier detector means that the mobile phone terminal has gone into a range of NFC short-distance communication with the non-contact reader/writer apparatus. At that time, the RF circuit for NFC communication responds to the receive carrier signal detected by the carrier detector to generate an NFC approach notification signal. The NFC approach notification signal is supplied to the baseband processor.

As the carrier detector for monitoring the signal level of a receive carrier signal from the coil antenna for NFC communication, an emitter follower type detector as described in JP-A-2006-099810 may be used. However, it was made clear from the study by the inventors that in this case, the detection transistor supplied with a fixed bias voltage consumes a large amount of DC power during the operation of monitoring the level of a receive carrier signal before start of an electronic payment operation.

As the carrier detector for monitoring the signal level of a receive carrier signal from the coil antenna for NFC communication, an RF detector as described in "Built-In Test of RF Mixers Using RF Amplitude Detectors" presented by Chaoming Zhang et al. may be used. However, also in this case, during the operation of monitoring the level of a receive carrier signal before start of an electronic payment operation, a DC bias voltage is supplied to the gate of each N-channel MOS transistor because of a resistance connected between the drain and gate of each the MOS transistor. Hence, as a result of the study by the inventors, it is made clear that the RF detector as described in "Built-In Test of RF Mixers Using RF Amplitude Detectors" presented by Chaoming Zhang et al. consumes a large amount of DC power during the operation of monitoring the level of a receive carrier signal.

The invention was made by the inventors as a result of the study prior to the invention as described above.

Therefore, it is an object of the invention to provide a detector whose DC power consumption is reduced in a condition that the amplitude level of an input signal is low.

It is another object of the invention to reduce DC power consumption by a carrier detector for monitoring the signal level of a carrier signal received through an antenna in a communication RF circuit incorporated in a mobile device terminal utilizing communication for settlement with a non-contact reader/writer apparatus for non-contact electronic payment.

The above and other objects and novel features of the invention will be apparent from the description hereof and the accompanying drawings.

Now, of the embodiments of the invention herein disclosed, preferred ones will be outlined below.

A detector (carrier signal detector) according to a preferred embodiment of the invention includes first and second input terminals (IN1, IN2), first and second transistors (M1, M2) and a load element (M3). The first input terminal and second input terminal are supplied with complementary input signals reverse to each other in phase respectively. The first input terminal is connected with a first input electrode of the first transistor and a second input electrode of the second transistor. The second input terminal is connected with a second input electrode of the first transistor and a first input electrode of the second transistor. The load element is connected between output electrodes of the first and second transistors and an operating voltage point (Vdd).

A detection voltage ($V_{IN1}$) resulting from full-wave rectification arises from a circuit node to which the output electrodes of the first and second transistors and the load element are connected (see FIG. 1).

The effect achieved by the preferred embodiments of the embodiments herein disclosed is as follows in brief. That is, it is possible to provide a detector whose DC power consumption is reduced in a condition that the amplitude level of an input signal is low.

BRIEF DESCRIPTION OF THE DRAWINGS

FIGS. 10A and 10B are diagrams each showing a mobile phone terminal having therein an RF circuit (RF chip) for NFC communication according to an embodiment of the invention, in which the RF circuit incorporates one of the various carrier detectors as described above;

DETAILED DESCRIPTION OF THE PREFERRED EMBODIMENTS

1. Summary of the Preferred Embodiments

Figure 1:
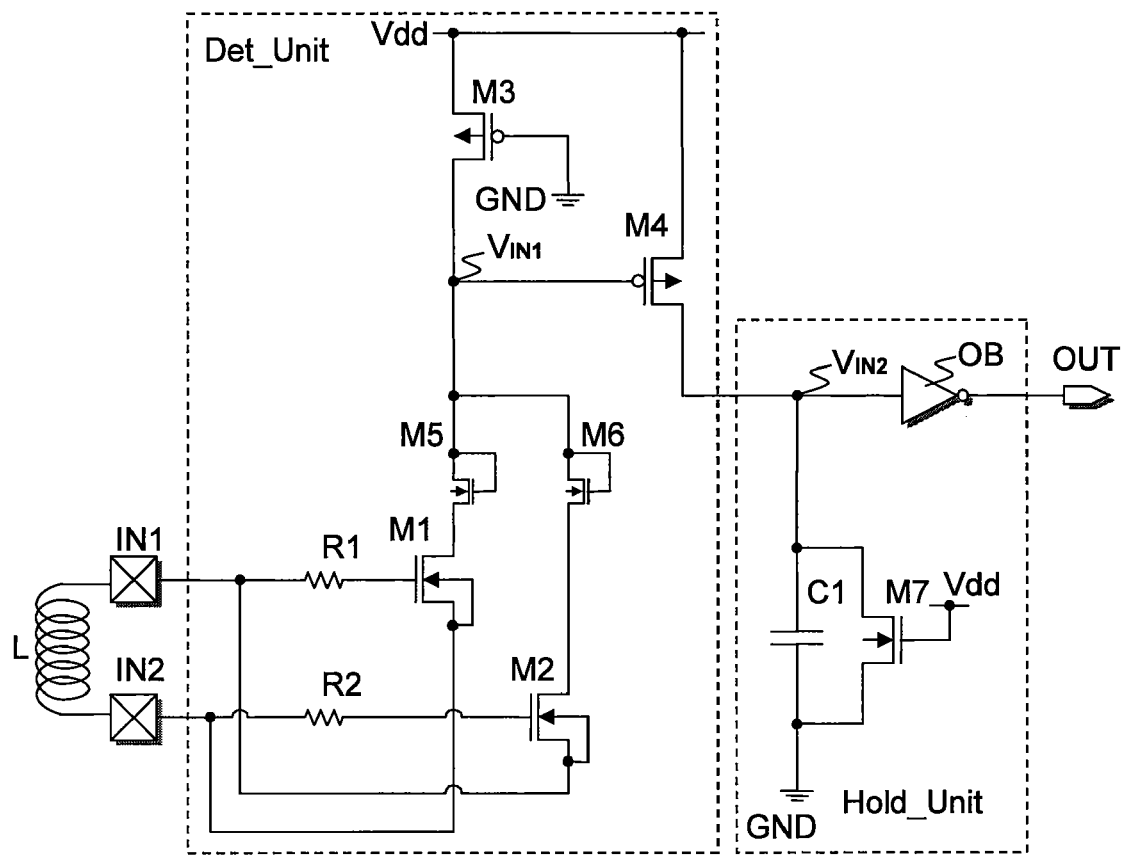
FIG. 1 is a diagram showing a carrier detector of an RF circuit for NFC communication according to an embodiment of the invention for monitoring the signal level of a receive carrier signal from a coil antenna for NFC communication, which is to be incorporated in a mobile phone terminal utilizing NFC communication with a non-contact reader/writer apparatus for non-contact electronic payment.

First, the preferred embodiments herein disclosed will be outlined. The reference numerals, characters and signs to refer to the drawings, which are accompanied with paired round brackets here, only exemplify what the concepts of components referred to by the numerals, characters and signs contain.

[1] A detector according to a preferred embodiment of the invention includes: a first input terminal (IN1); a second input terminal (IN2); a first transistor (M1); a second transistor (M2); and a load element (M3).

The first and second input terminals are can be supplied with complementary input signals reverse to each other in phase.

The first and second transistors each include first and second input electrodes and an output electrode. The first and second transistors supply output currents from the output electrodes in response to supply of an input voltage having a predetermined polarity and a predetermined voltage level to the first and second input electrodes.

The first input terminal is connected to the first input electrode of the first transistor and the second input electrode of the second transistor, and the second input terminal is connected to the second input electrode of the first transistor and the first input electrode of the second transistor.

The load element is connected between the output electrodes of the first and second transistors and an operating voltage point (Vdd).

The first transistor is larger in degree of conduction than the second transistor in a first cycle where a voltage of the second input terminal shows one of positive and negative polarities with respect to a voltage of the first input terminal.

The second transistor is larger in degree of conduction than the first transistor in a second cycle where the voltage of the second input terminal shows the other polarity with respect to the voltage of the first input terminal.

A detection voltage ($V_{IN1}$) resulting from full-wave rectification arises from a circuit node to which the output electrodes of the first and second transistors and the load element are connected (see FIG. 1).

According to the embodiment, in a condition that a signal input between the first and second input terminals is at a low amplitude level below the predetermined voltage level, the first and second transistors are both put out of conduction. Therefore, according to the above-described embodiment, it is possible to provide a detector which is reduced in DC power consumption in a condition that an input signal is at low amplitude level.

The detector according to a preferable embodiment further includes a first element (M5) for preventing countercurrent connected between the circuit node and the output electrode of the first transistor, and a second element (M6) for preventing countercurrent connected between the circuit node and the output electrode of the second transistor (see FIG. 1).

According to the preferable embodiment, the first and second elements for preventing countercurrent block a backward flowing current which is caused by breakdown of one of the first and second transistors when the other transistor is turned on in response to an excessive input signal applied to the first and second input terminals.

The detector according to a more preferable embodiment further includes a first resistance (R1) for preventing electrostatic destruction connected between the first input terminal and the first input electrode of the first transistor, and a second resistance (R2) for preventing electrostatic destruction connected between the second input terminal and the first input electrode of the second transistor (see FIG. 1).

According to the more preferable embodiment, the first and second resistances for preventing electrostatic destruction serve to absorb the energy of an external surge voltage applied to the first and second input terminals, and prevent electrostatic destruction of the first and second transistors.

The detector according to a still more preferable embodiment further includes an amplifier transistor (M4) having a first input electrode connected to the circuit node and a second input electrode connected to the operating voltage point (Vdd). An inverted and amplified detection voltage ($V_{IN2}$) arises from an output electrode of the amplifier transistor (see FIG. 1).

The detector according to a specific embodiment further includes a parallel-connected combination composed of a holding capacitance (C1) and an element for preparing a discharge time constant (M7), and connected between the output electrode of the amplifier transistor and another operating voltage point (GND), and an output circuit (OB) with an input terminal connected with the output electrode of the amplifier transistor. The output circuit has a predetermined input threshold voltage, and the output circuit judges a voltage level of the inverted and amplified detection voltage based on the input threshold voltage (see FIG. 1).

According to the specific embodiment, a detection output signal from the output circuit can be kept at a normal level by a holding time depending on the discharge time constant prepared by the parallel-connected combination and the input threshold voltage of the output circuit even in case that the amplitudes of the complementary input signals become low levels discontinuously.

In the detector according to the most specific embodiment, the first and second transistors, and first and second elements for preventing countercurrent are N-channel MOS transistors, and the load element and amplifier transistor are P-channel MOS transistors (see FIG. 1).

[2] An RF circuit (108) according to a preferred embodiment in connection with another aspect of the invention can be electrically connected to a processor (100, 103) having a data processing function, and a microcomputer (106) having an encrypted electronic payment function.

The RF circuit includes a detector (1081A) for detecting a signal received from a non-contact reader/writer apparatus through an antenna (107).

The detector monitors a signal level of the receive signal from the non-contact reader/writer apparatus, which has been received through the antenna. Also, the detector generates a detected signal (NFC_ApDet) in response to the signal level equal to or over a predetermined threshold, and supplies the detected signal to the processor.

The processor generates a start signal (NFC_Start) in response to the detected signal, and supplies the start signal to the RF circuit.

The RF circuit starts supplying an operation clock (CLK) to the microcomputer in response to the start signal, whereby an encrypted electronic payment operation by the microcomputer is started.

Payment transmit data resulting from the encrypted electronic payment operation is supplied to the RF circuit through electrical connection (1064, 1086) with the microcomputer. The RF circuit includes an RF transmit unit (TX) for sending the payment transmit data to the non-contact reader/writer apparatus through the antenna (see FIGS. 11 and 12).

The detector includes a first input terminal (IN1), a second input terminal (IN2), a first transistor (M1), a second transistor (M2) and a load element (M3).

The first and second input terminals can be supplied with complementary input signals reverse to each other in phase.

The first and second transistors each include first and second input electrodes and an output electrode. The first and second transistors emit output currents from the output electrodes in response to supply of an input voltage having a predetermined polarity and a predetermined voltage level to the first and second input electrodes.

The first input terminal is connected to the first input electrode of the first transistor and the second input electrode of the second transistor, and the second input terminal is connected to the second input electrode of the first transistor and the first input electrode of the second transistor.

The load element is connected between the output electrodes of the first and second transistors and an operating voltage point (Vdd).

The first transistor is larger in degree of conduction than the second transistor in a first cycle where a voltage of the second input terminal shows one of positive and negative polarities with respect to a voltage of the first input terminal.

The second transistor is larger in degree of conduction than the first transistor in a second cycle where the voltage of the second input terminal shows the other polarity with respect to the voltage of the first input terminal.

A detection voltage ($V_{IN1}$) resulting from full-wave rectification arises from a circuit node to which the output electrodes of the first and second transistors and the load element are connected (see FIG. 1).

According to a preferable embodiment, the processor includes at least one of a baseband processor (100) and an application processor (103) for transmission and reception between a mobile phone terminal and a base station.

[3] A mobile device (MoPh) according to a preferred embodiment in connection with another aspect of the invention may incorporate a battery (109), a processor (100, 103), a microcomputer (106), an antenna (107) and an RF circuit (108).

The battery supplies the processor, microcomputer, RF circuit with a source voltage (Vdd).

The processor has a data processing function. The microcomputer (106) has an encrypted electronic payment function. The antenna is for receiving a receive signal from a non-contact reader/writer apparatus, and sending a transmit signal to the apparatus. The RF circuit is supplied with the receive signal and produces the transmit signal.

The RF circuit can be electrically connected to the processor and microcomputer.

The RF circuit includes a detector (1081A) for detecting the receive signal from the non-contact reader/writer apparatus, which has been received through the antenna.

The detector monitors a signal level of the receive signal from the non-contact reader/writer apparatus, which has been received through the antenna. Also, the detector generates a detected signal (NFC_ApDet) in response to the signal level equal to or over a predetermined threshold, and supplies the detected signal to the processor.

The processor generates a start signal (NFC_Start) in response to the detected signal, and supplies the start signal to the RF circuit.

The RF circuit starts supplying an operation clock (CLK) to the microcomputer in response to the start signal, whereby an encrypted electronic payment operation by the microcomputer is started.

Payment transmit data resulting from the encrypted electronic payment operation is supplied to the RF circuit through electrical connection (1064, 1086) with the microcomputer. The RF circuit includes an RF transmit unit (TX) for sending the payment transmit data to the non-contact reader/writer apparatus through the antenna (see FIGS. 11 and 12).

The detector includes a first input terminal (IN1), a second input terminal (IN2), a first transistor (M1), a second transistor (M2) and a load element (M3).

The first and second input terminals can be supplied with complementary input signals reverse to each other in phase.

The first and second transistors each include first and second input electrodes and an output electrode. The first and second transistors emit output currents from the output electrodes in response to supply of an input voltage having a predetermined polarity and a predetermined voltage level to the first and second input electrodes.

The first input terminal is connected to the first input electrode of the first transistor and the second input electrode of the second transistor, and the second input terminal is connected to the second input electrode of the first transistor and the first input electrode of the second transistor.

The load element is connected between the output electrodes of the first and second transistors and an operating voltage point (Vdd).

The first transistor is larger in degree of conduction than the second transistor in a first cycle where a voltage of the second input terminal shows one of positive and negative polarities with respect to a voltage of the first input terminal.

The second transistor is larger in degree of conduction than the first transistor in a second cycle where the voltage of the second input terminal shows the other polarity with respect to the voltage of the first input terminal.

A detection voltage ($V_{IN1}$) resulting from full-wave rectification arises from a circuit node to which the output electrodes of the first and second transistors and the load element are connected (see FIG. 1).

According to a preferable embodiment, the processor includes at least one of a baseband processor (100) and an application processor (103) for transmission and reception between a mobile phone terminal and a base station.

[4] A detector according to an embodiment in connection with another aspect of the invention includes at least a first input terminal (IN1), a second input terminal (IN2), a transistor (M1) and a load element (M3).

The first input terminal (IN1) and second input terminal (IN2) can be connected with two opposing ends of an antenna (L) respectively. The first input terminal (IN1) and second input terminal (IN2) can be supplied with complementary input signals reverse to each other in phase at the opposing ends of the antenna (L).

The transistor includes first and second input electrodes and an output electrode. The first and second transistors emit output currents from the output electrodes in response to supply of an input voltage having a predetermined polarity and a predetermined voltage level to the first and second input electrodes.

The first input terminal is connected to the first input electrode of the transistor, and the second input terminal is connected to the second input electrode of the transistor.

The load element is connected between the output electrode of the transistor and an operating voltage point (Vdd).

The degree of conduction of the transistor rises in a first cycle where a voltage of the second input terminal shows one of positive and negative polarities with respect to a voltage of the first input terminal, and the degree of conduction of the transistor lowers in a second cycle where the voltage of the second input terminal shows the other polarity with respect to the voltage of the first input terminal.

A detection voltage ($V_{IN1}$) resulting from rectification arises from a circuit node to which the output electrode of the transistor and the load element are connected (see FIG. 1).

2. Further Detailed Description of the Preferred Embodiments

The embodiments will be described further in detail.
<<Configuration of the Carrier Detector>>

FIG. 1 is a diagram showing a carrier detector of an RF circuit (RF chip) for NFC communication according to an embodiment of the invention for monitoring the signal level of a receive carrier signal from a coil antenna for NFC communication, which is to be incorporated in a mobile phone terminal utilizing NFC communication with a non-contact reader/writer apparatus for non-contact electronic payment. The RF circuit (RF chip) for NFC communication is, for example, a semiconductor IC fabricated on a substrate of semiconductor such as monocrystalline silicon by the complementary MOS IC manufacturing technique.

The carrier detector of the RF chip serving as an RF circuit for NFC communication shown in FIG. 1 includes a detection unit Det_Unit and a holding unit Hold_Unit. The RF chip includes a first input terminal IN1 and a second input terminal IN2, which are connected to one end of a coil antenna L for NFC communication and the other end respectively; the coil antenna is provided outside the chip. The first and second input terminals IN1 and IN2 are also connected to a demodulator Dmd which is to be described later with reference to FIG. 12. A receive carrier signal received through the coil L for NFC communication undergoes amplitude demodulation by the demodulator Dmd, and then a rectangular wave of a receive data (ASK demodulation data) is produced.

The detection unit Det_Unit includes a first N-channel MOS transistor M1 for detection, a second N-channel MOS transistor M2, a load P-channel MOS transistor M3 and a P-channel amplifier MOS transistor M4. The gate and source of the first NMOS transistor M1 are connected with the first input terminal IN1 and the second input terminal IN2, respectively. The gate and source of the second NMOS transistor M2 are connected with the second input terminal IN2 and the first input terminal IN1, respectively. Between the gate of the first NMOS transistor M1 and the first input terminal IN1 is connected a first resistance R1, whereas between the gate of the second NMOS transistor M2 and the second input terminal IN2 is connected a second resistance R2. The drains of the first and second NMOS transistors M1 and M2 are connected to the source voltage Vdd of a battery through an electric current path running between the drain and source of the load P-channel MOS transistor M3 with a gate connected to the ground voltage GND. To the drains of the first and second NMOS transistors M1 and M2, diode-connected N-channel MOS transistors M5 and M6 to prevent countercurrent are connected.

In the carrier detector shown in FIG. 1, the first and second resistances R1 and R2 serve to absorb the energy of an external surge voltage applied to the first and second input terminals IN1 and IN2, and function to prevent electrostatic destruction of the first and second NMOS transistors M1 and M2. The transistors M5 and M6 for preventing countercurrent block a backward flowing current which is caused by breakdown of a parasitic PN junction between the P-type well and N-type drain of one of the first and second NMOS transistors M1 and M2 when the other transistor is turned on in response to an excessive input signal applied to the first and second input terminals IN1 and IN2.

Hence, when a mobile phone terminal is put within a range of NFC short-distance communication with a non-contact reader/writer apparatus, received carrier complementary signals reverse to each other in phase are supplied to the first and second input terminals IN1 and IN2 connected with two opposing ends of the coil antenna L for NFC communication. In a cycle such that the first input terminal IN1 is positive in voltage with respect to the second input terminal IN2, the degree of conduction of the first NMOS transistor M1 becomes higher, and the voltage drop by the load PMOS transistor M3 is enlarged. Further, in a cycle such that the second input terminal IN2 is positive in voltage with respect to the first input terminal IN1, the degree of conduction of the second NMOS transistor M2 becomes higher, and the voltage drop by the load PMOS transistor M3 is enlarged. Therefore, a detection voltage $V_{IN1}$ resulting from full-wave rectification arises at drains of the first and second NMOS transistors M1 and M2. The amplifier PMOS transistor M4 amplifies the detection voltage $V_{IN1}$ to make an inverted and amplified detection voltage $V_{IN2}$. The inverted and amplified detection voltage arising at the drain of the amplifier PMOS transistor M4 is supplied to the input terminal of the holding unit Hold_Unit.

However, in case that the mobile phone terminal is out of the range of NFC short-distance communication with a non-contact reader/writer apparatus, the level of the receive carrier signal between the first and second input terminals IN1 and IN2 is low, the first and second NMOS transistors M1 and M2 are both put out of conduction. In this way, the detection unit Det_Unit can reduce the power consumption owing to the monitoring operation of the level of a receive carrier signal.

The holding unit Hold_Unit having an input which the inverted and amplified detection voltage $V_{IN2}$ arising at the drain of the amplifier PMOS transistor M4 of the detection unit Det_Unit is supplied to includes a holding capacitance C1, an N-channel MOS transistor M7 serving as a high resistance for forming a discharge time constant, and an output buffer OB. The output buffer OB is composed of a CMOS inverter which inverts the inverted and amplified detection voltage $V_{IN2}$ to produce a detection output signal OUT. It is judged by the logic threshold voltage VLth of the CMOS inverter used as the output buffer OB whether the inverted and amplified detection voltage $V_{IN2}$ at the output of the output buffer OB is at High level or Low level.

The detection output signal OUT arising from the output buffer OB can be used as an NFC approach notification signal NFC_ApDet, which is to be described later with reference to FIG. 11. In addition, other delay element or logic element may be connected between the input of the output buffer OB and an output of the holding unit from which the detection output signal OUT arises.

<<Detecting Operation by the Carrier Detector>>

Figure 2:
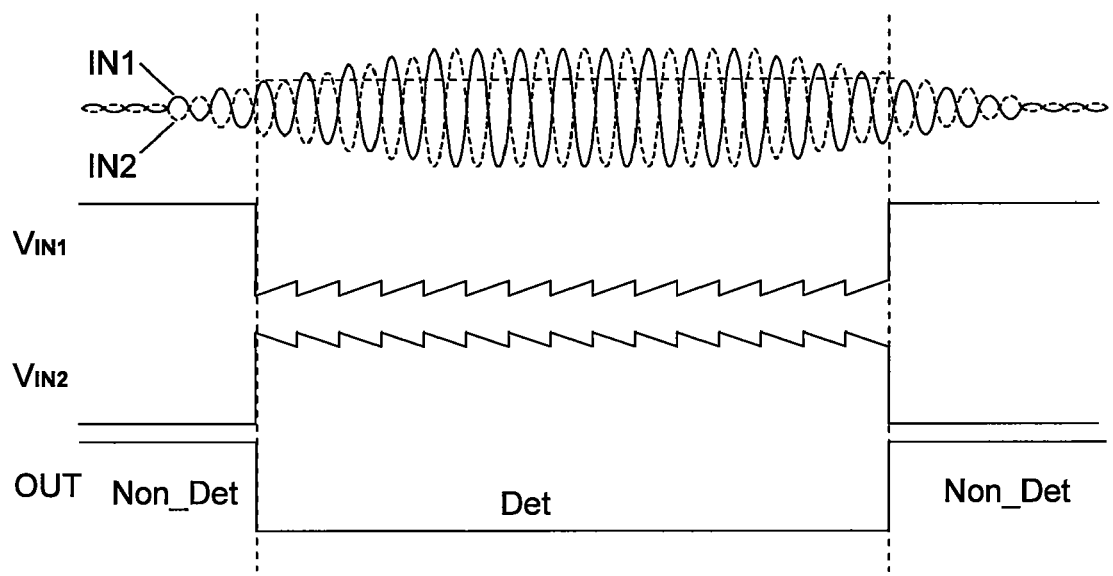
FIG. 2 is a diagram of assistance in explaining the circuit operation of the carrier detector shown in FIG. 1 when the detector monitors the signal level of a receive carrier signal from the coil antenna L for NFC communication.

FIG. 2 is a diagram of assistance in explaining the circuit operation of the carrier detector shown in FIG. 1 when the detector monitors the signal level of a receive carrier signal from the coil antenna L for NFC communication.

The top portion of FIG. 2 shows waveforms of received carrier complementary signals reverse to each other in phase at the first input terminal IN1 and second input terminal IN1, which are connected to the two opposing ends of the coil antenna L for NFC communication.

The upper and lower halves of the center portion of FIG. 2 show a waveform of the full-wave rectification detection voltage $V_{IN1}$ at the drains of the first and second NMOS transistors M1 and M2 in the detection unit Det_Unit, and a waveform of the inverted and amplified detection voltage $V_{IN2}$ at the drain of the amplifier PMOS transistor M4.

The bottom portion of FIG. 2 shows a waveform of a detection output signal OUT of the holding unit Hold_Unit. The detection output signal OUT is supplied to a baseband processor 100 as an NFC approach notification signal NFC_ApDet, which is to be described later with reference to FIG. 11.

As is clear from the top portion of FIG. 2, the amplitude of the received carrier complementary signals reverse to each other in phase at the two ends of the coil antenna L for NFC communication changes in level from Low through High to Low. While the received carrier complementary signals are at Low level as shown on the left and right of the top portion of FIG. 2, the first and second NMOS transistors M1 and M2 are put out of conduction, the voltage drop by the load PMOS transistor M3 is small, the full-wave rectification detection voltage $V_{IN1}$ is at High level, the inverted and amplified detection voltage $V_{IN2}$ is at Low level, and the detection output signal OUT is at High level. In this situation, the DC bias to the first and second NMOS transistors M1 and M2 for monitoring the level of the receive carrier signal of the carrier detector as shown in FIG. 2 is zero. Therefore, DC power consumption during the time of the monitoring operation can be cut significantly.

When the received carrier complementary signals reach High level as shown in a central part of the top portion of FIG. 2, the first and second NMOS transistors M1 and M2 are first brought into conduction. Then, the voltage drop by the load PMOS transistor M3 is increased, the full-wave rectification detection voltage $V_{IN1}$ is turned to Low level, and the inverted and amplified detection voltage $V_{IN2}$ is made High level, resulting in the detection output signal OUT at Low level.

In the meantime, a class B push-pull amplifier circuit operable to drive a load with a low power consumption has been well known as an output amplification stage of a power amplifier. In a class B push-pull amplifier circuit, a pushing action by which a transistor closer to the source voltage supplies a charge current to a load is performed in a half cycle in which an input signal is positive, and a pulling action by which a transistor closer to the ground voltage forces a discharge current to pass through the load is executed in a half cycle in which the input signal is negative. Further, with the class B push-pull amplifier circuit, under the condition of no input signal, an operation with low power consumption can be achieved by setting a small DC bias current of the transistor closer to the source voltage and the transistor closer to the ground voltage to be small in the standby state.

Unlike a class B push-pull amplifier circuit as described above, the first and second NMOS transistors M1 and M2 of the detection unit Det_Unit of the carrier detector of FIG. 2 execute an operation of class B pull-pull full-wave rectification detection with a low power consumption through first and second PULL detections in such half cycles of positive and negative detection input signals.

Figure 3:
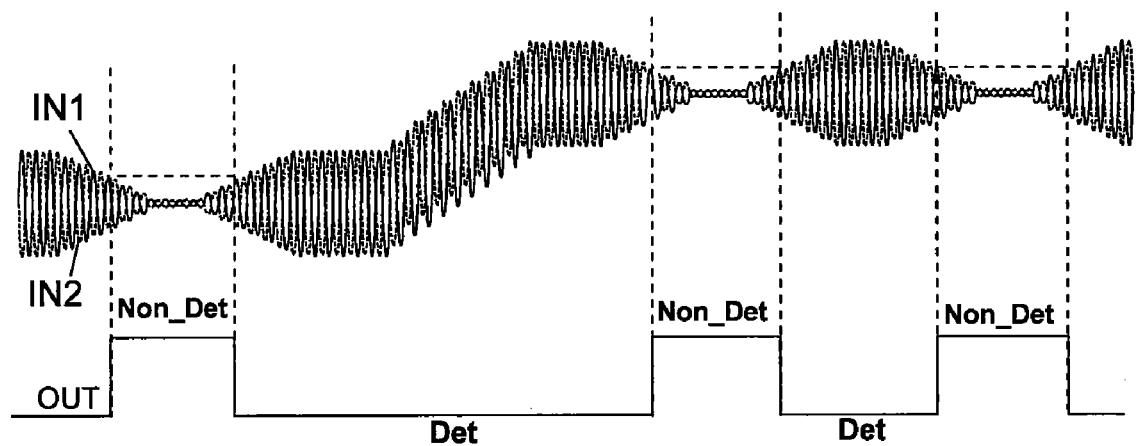
FIG. 3 is a diagram of assistance in explaining the circuit operation of the carrier detector shown in FIG. 1 when the detector monitors the signal level of a receive carrier signal from the coil antenna L for NFC communication like FIG. 2.

FIG. 3 is a diagram of assistance in explaining the circuit operation of the carrier detector shown in FIG. 1 when the detector monitors the signal level of a receive carrier signal from the coil antenna L for NFC communication like FIG. 2. FIG. 3 shows a waveform of the detection output signal OUT in case that the DC level of the receive carrier signal fluctuates while the amplitude thereof varies.

In the detection unit Det_Unit, the received carrier complementary signals reverse to each other in phase, which have reached the coil antenna L for NFC communication, are supplied, like direct current, to the gate and source of the first NMOS transistor M1 and the gate and source of the second NMOS transistor M2 through the first and second input terminals IN1 and IN2 respectively connected with the two ends of the coil antenna. Now, as a matter of course, in this manner of supply like direct current, the received carrier complementary signals reverse to each other in phase are supplied, as direct current, the gate and source of the first transistor M1 and the gate and source of the second transistor M2 without passing through a built-in capacitance of the IC chip containing the carrier detector (i.e. RF chip for NFC communication) as shown in FIG. 1. Hence, even in case that the DC level of the received carrier complementary signals fluctuates, the voltage between the gate and source remains constant as to both the first and second NMOS transistors M1 and M2 and therefore, the drain currents of the first and second NMOS transistors M1 and M2 both never fluctuates. Consequently, as shown in a portion near to and on the left of the center of FIG. 3, even when the received carrier complementary signals fluctuate in DC level, a normal waveform of the detection output signal OUT of Low level can be gained as long as the received carrier complementary signals are at High level in amplitude.

In this case, it is not required to provide two capacitances for blocking DC current as described in "Built-In Test of RF Mixers Using RF Amplitude Detectors" presented by Chaoming Zhang et al. on the IC chip of the carrier detector shown in FIG. 1 or a printed circuit board outside the IC chip. Therefore, the prime cost of the IC chip or printed circuit board and the occupied area thereof can be reduced.

Figure 4:
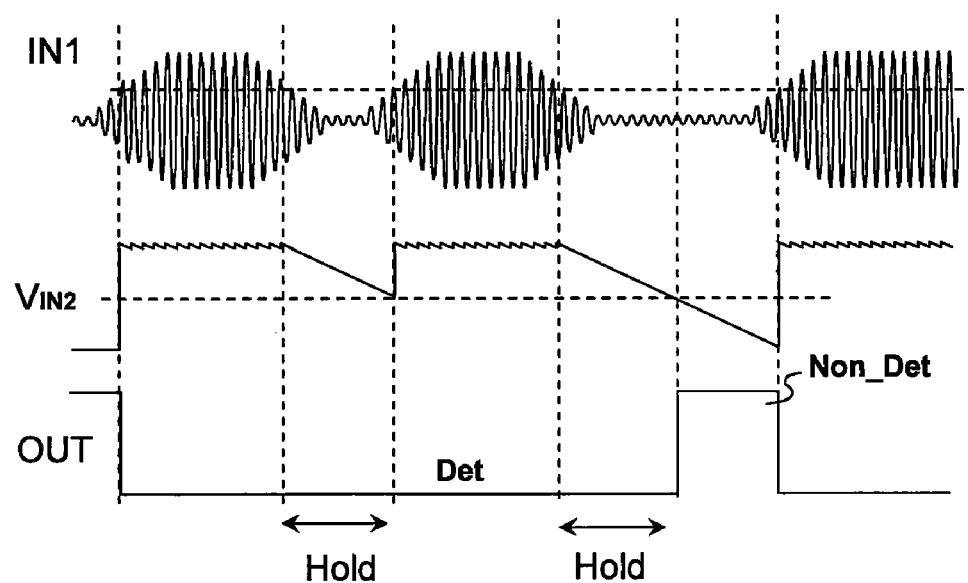
FIG. 4 is a diagram of assistance in explaining the circuit operation of the carrier detector shown in FIG. 1 when the detector monitors the signal level of a receive carrier signal from the coil antenna L for NFC communication like FIGS. 2 and 3.

FIG. 4 is a diagram of assistance in explaining the circuit operation of the carrier detector shown in FIG. 1 when the detector monitors the signal level of a receive carrier signal from the coil antenna L for NFC communication like FIGS. 2 and 3. FIG. 4 shows a waveform of the detection output signal OUT in case that the amplitude of the receive carrier signal fluctuates discontinuously. In the holding unit Hold_Unit of the carrier detector shown in FIG. 1, the discharge time constant is decided by the holding capacitance C1 and the high resistance of the N-channel MOS transistor M7.

Therefore, in case that a period during which the receive carrier signal takes an amplitude of Low level discontinuously is shorter than the holding time Hold depending on the discharge time constant, the inverted and amplified detection voltage $V_{IN2}$ arising from the drain of the amplifier PMOS transistor M4 never lowers to or below the logic threshold voltage VLth of the CMOS inverter used as the output buffer OB. Hence, in this case, the detection output signal OUT is kept at a normal Low level.

However, in case that a period during which the receive carrier signal takes an amplitude of Low level discontinuously is longer than the holding time Hold, the inverted and amplified detection voltage $V_{IN2}$ arising from the drain of the amplifier PMOS transistor M4 lowers to or below the logic threshold voltage VLth of the CMOS inverter used as the output buffer OB. In this case, the detection output signal OUT will change from normal Low level to abnormal High level.

For example, the discontinuous fluctuations in the amplitude of the receive carrier signal occur in cases of Type-A, one of NFC standards. Specifically, in NFC communication of Type-A, the AM percentage modulation in amplitude modulation (ASK demodulation) is set to 100%, and therefore a period during which a carrier signal disappears discontinuously crops up. The period of carrier disappearance is up to 2.95 microseconds, which was derived as follows.

$$1/13.56 MHz \times 40 = 2.95 \mu s$$

The discharge time constant depending on a combination of a capacitance value of the holding capacitance C1 and a resistance value of the N-channel MOS transistor M7 of the holding unit Hold_Unit of the carrier detection circuit shown in FIG. 1 shall be set to a time larger than the longest period of carrier disappearance 2.95 microseconds. By taking a measure like this, it becomes possible to avoid that the detection output signal OUT arising from the output buffer OB changes from normal Low level to abnormal High level during the period of carrier disappearance in Type A NFC communication of 100% ASK modulation. Thus, no detection output signal OUT is changed to normal High level until a mobile phone terminal equipped with an RF circuit for NFC communication as shown in FIG. 1 is brought out of the range of NFC short-distance communication with a non-contact reader/writer apparatus, and thus the amplitude of a receive carrier signal completely vanishes for a long time. Further, NFC communication by the RF circuit for NFC communication according to the embodiment of the invention, which is shown in FIG. 1, is not limited to Type-A NFC communication of 100% ASK modulation. It is needless to say that the invention is applicable to Type-B and Felica (Type-c) of 10% ASK modulation of communication standards of NFC.

<<Modifications of the Carrier Detector>>

Figure 5:
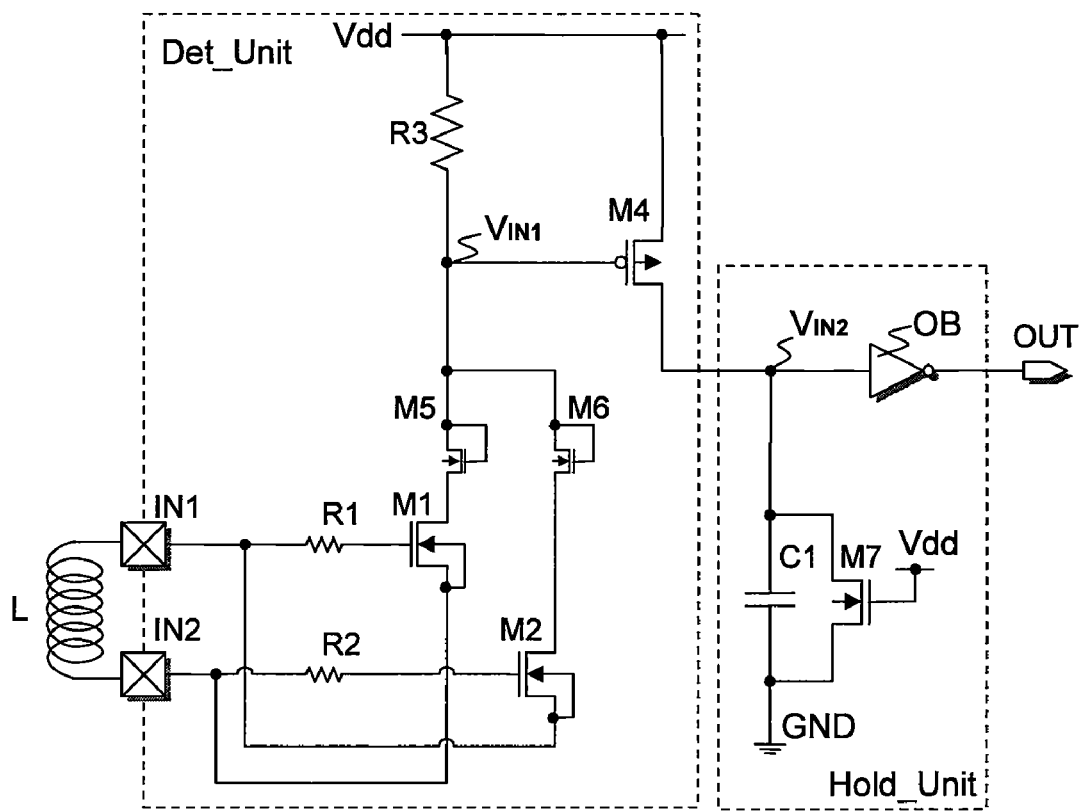
FIG. 5 is a diagram of assistance in explaining a modification of the carrier detector shown in FIG. 1, which monitors the signal level of a receive carrier signal from the coil antenna L for NFC communication.

FIG. 5 is a diagram of assistance in explaining a modification of the carrier detector shown in FIG. 1, which monitors the signal level of a receive carrier signal from the coil antenna L for NFC communication.

The detector shown in FIG. 5 differs from the detector shown in FIG. 1 in that it has a load resistance R3 instead of the load PMOS transistor M3 of FIG. 1. However, other constituents are common to the detectors.

Figure 6:
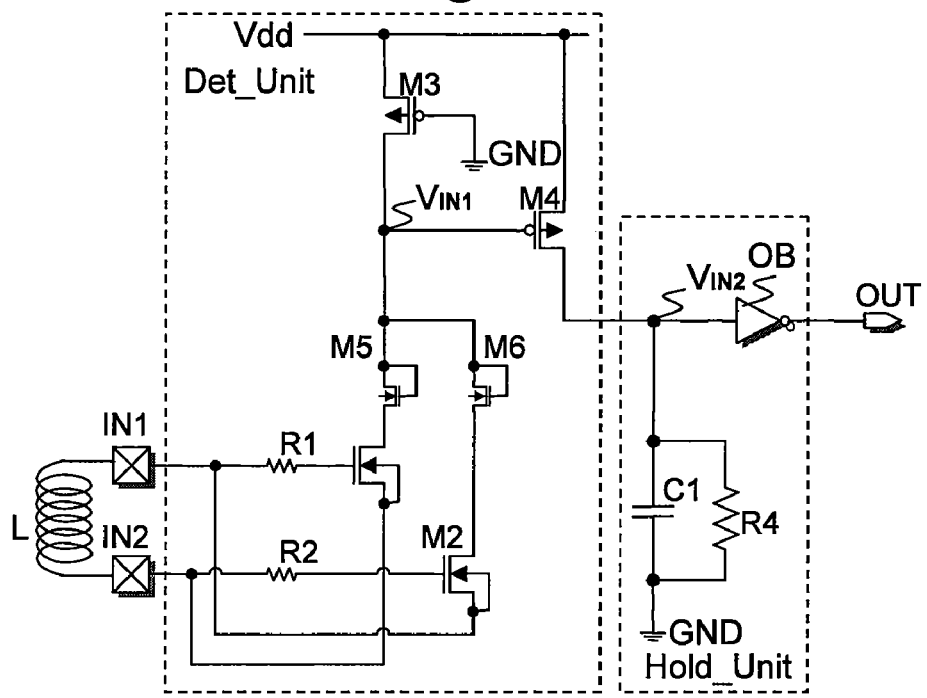
FIG. 6 is a diagram of assistance in explaining another modification of the carrier detector shown in FIG. 1, which monitors the signal level of a receive carrier signal from the coil antenna L for NFC communication.

Also, FIG. 6 is a diagram of assistance in explaining another modification of the carrier detector shown in FIG. 1, which monitors the signal level of a receive carrier signal from the coil antenna L for NFC communication.

The detector shown in FIG. 6 differs from the detector shown in FIG. 1 in that it has a resistance R4 instead of the NMOS transistor M7 for preparing a discharge time constant of the holding unit Hold_Unit of FIG. 1. However, other constituents are common to the detectors.

Figure 7:
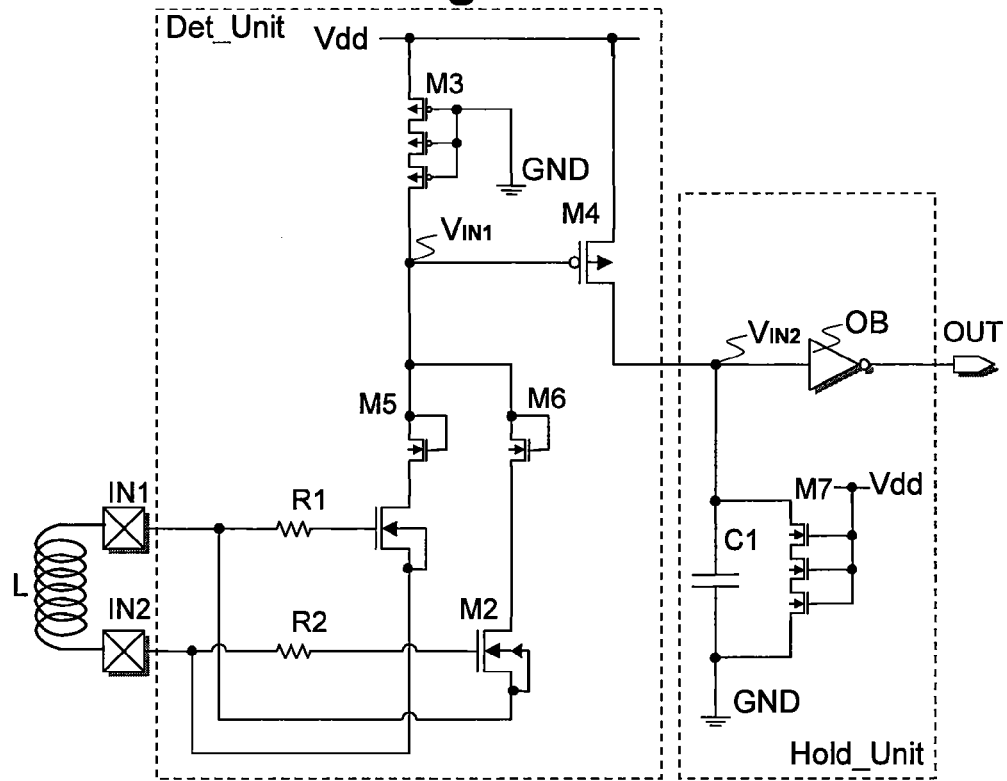
FIG. 7 is a diagram of assistance in explaining another modification of the carrier detector shown in FIG. 1, which monitors the signal level of a receive carrier signal from the coil antenna L for NFC communication.

Also, FIG. 7 is a diagram of assistance in explaining another modification of the carrier detector shown in FIG. 1, which monitors the signal level of a receive carrier signal from the coil antenna L for NFC communication.

The detector shown in FIG. 7 differs from the detector shown in FIG. 1 in that it has a series of three PMOS transistors M3 instead of the load PMOS M3 of FIG. 1, and a series of three NMOS transistors M7 instead of the NMOS M7 for preparing a discharge time constant of the holding unit Hold_Unit of FIG. 1. The load resistance of the load PMOS can be increased by using the series of three cascode-connected MOS transistors as the load PMOS M3. Further, the discharge time constant of the holding unit Hold_Unit can be made larger by using the series of three cascode-connected MOS transistors as the NMOS M7 for preparing the discharge time constant.

Figure 8:
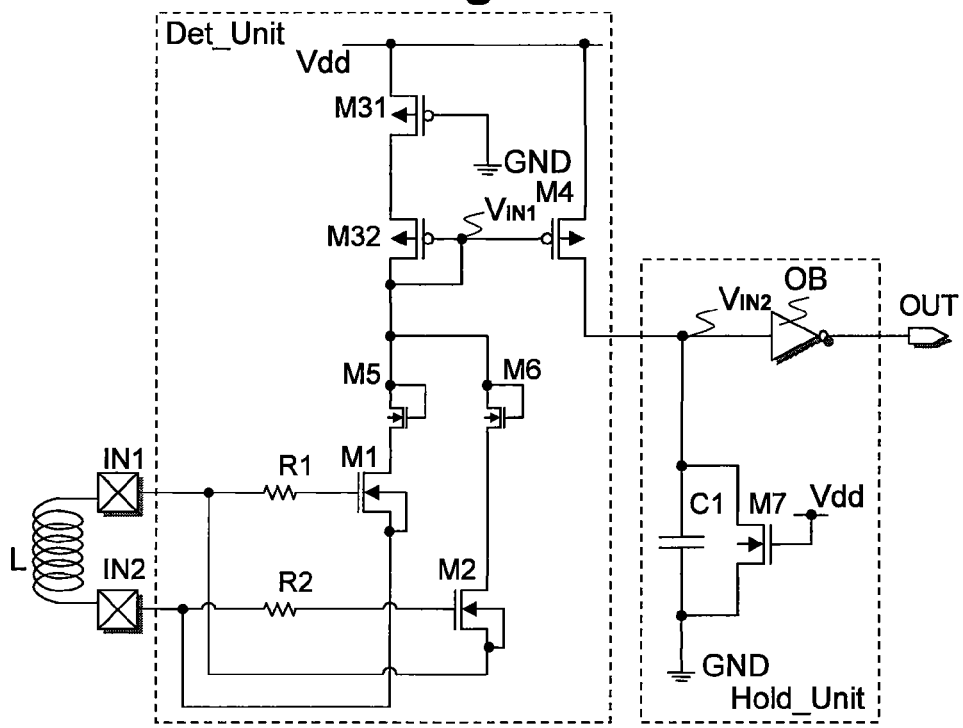
FIG. 8 is a diagram of assistance in explaining another modification of the carrier detector shown in FIG. 1, which monitors the signal level of a receive carrier signal from the coil antenna L for NFC communication.

Also, FIG. 8 is a diagram of assistance in explaining another modification of the carrier detector shown in FIG. 1, which monitors the signal level of a receive carrier signal from the coil antenna L for NFC communication.

The detector shown in FIG. 8 differs from the detector shown in FIG. 1 in that the drains of the first and second NMOS transistors M1 and M2 are connected through the MOS transistors M5 and M6 for preventing countercurrent to a combination of a diode-connected PMOS transistor M32 and a PMOS transistor M31 with its gate grounded, which are connected in series. Therefore, in the detector shown in FIG. 8, the gate of the amplifier PMOS transistor M4 is driven by voltage drop caused by the combination of the diode-connected PMOS transistor M32 and PMOS transistor M31 with its gate grounded, which are connected in series.

Figure 9:
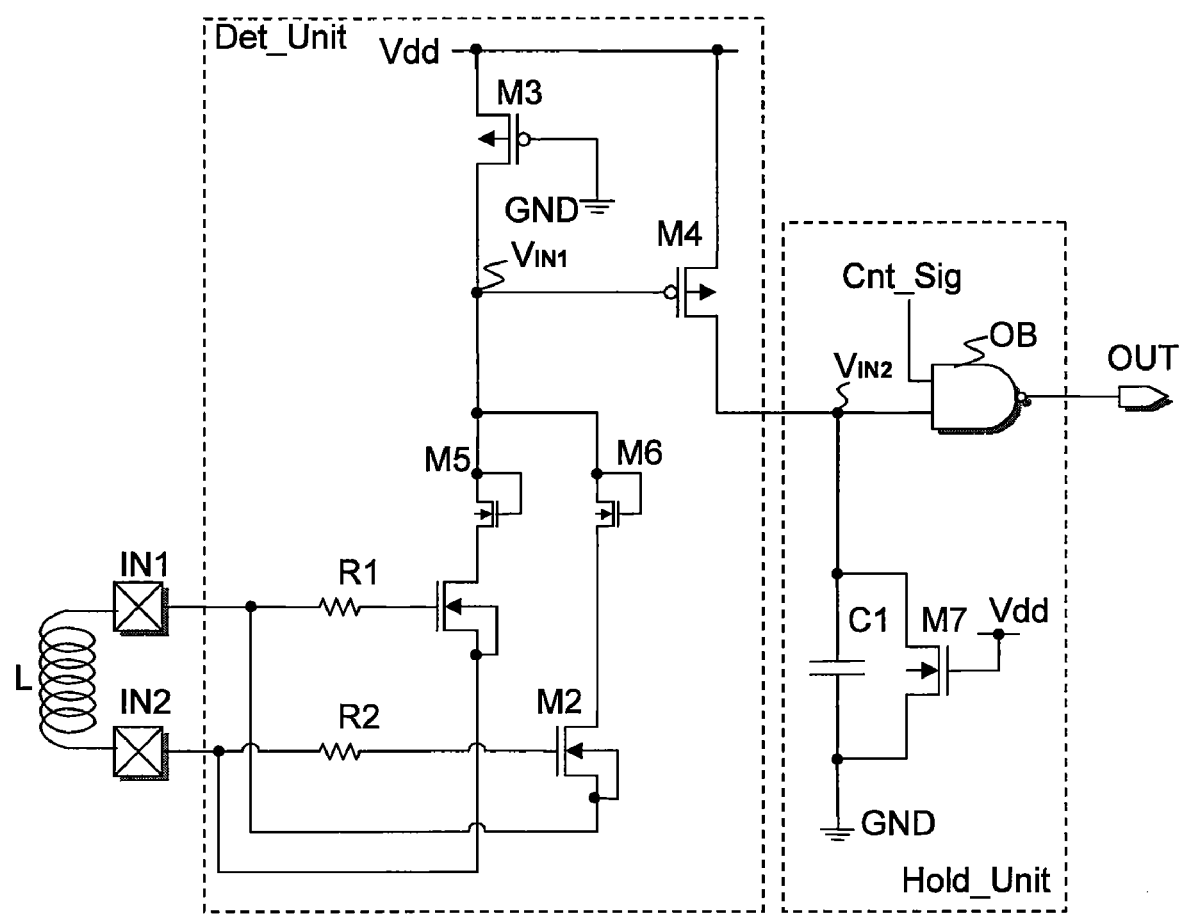
FIG. 9 is a diagram of assistance in explaining another modification of the carrier detector shown in FIG. 1, which monitors the signal level of a receive carrier signal from the coil antenna L for NFC communication.

Also, FIG. 9 is a diagram of assistance in explaining another modification of the carrier detector shown in FIG. 1, which monitors the signal level of a receive carrier signal from the coil antenna L for NFC communication.

The detector shown in FIG. 9 differs from the detector shown in FIG. 1 in that the CMOS inverter used as the output buffer OB of the holding unit Hold_Unit of FIG. 1 is replaced with a CMOS NAND circuit. The inverted and amplified detection voltage $V_{IN2}$ from the drain of the amplifier PMOS transistor M4 is supplied to one input terminal of the CMOS NAND circuit, and a control signal Cnt_Sig is supplied to the other input terminal.

Therefore, as to the detector shown in FIG. 9, only in case that the control signal Cnt_Sig is at High level "1", a normal detection output signal OUT at Low level "0" can be gained from an output of the CMOS NAND circuit used as the output buffer OB in response to the inverted and amplified detection voltage $V_{IN2}$ of High level "1". In other cases, an output from the CMOS NAND circuit used as the output buffer OB makes a detection output signal OUT at High level "1". Hence, the control signal Cnt_Sig of High level "1" serves as an enable signal which allows a carrier to be detected. In contrast, the control signal Cnt_Sig of Low level "0" serves as a disable signal which makes impossible to detect a carrier.

<<Mobile Phone Terminal Using NFC Communication>>

FIGS. 10A and 10B are diagrams each showing a mobile phone terminal having therein an RF circuit (an RF chip which is formed on a semiconductor substrate) for NFC communication according to an embodiment of the invention, in which the RF circuit incorporates one of the various carrier detectors as described above.

FIG. 10A is a diagram of assistance in explaining the flow of a signal inside the mobile phone terminal MoPh chiefly. FIG. 10B is a diagram of assistance in explaining the way a source voltage from a battery is supplied in an internal circuit inside the mobile phone terminal MoPh chiefly.

As shown in FIG. 10A, the mobile phone terminal MoPh incorporates an antenna ANT, an RFIC 101, an RF power amplifier 102, a baseband processor 100, an application processor 103, a liquid crystal display device 104, a SIM card 105 and an IC-card microcomputer 106. According to an embodiment of the invention, the mobile phone terminal MoPh shown in FIG. 10A has therein a coil antenna 107 for NFC communication and an RF circuit 108 for NFC communication particularly. As shown in FIG. 10B, the mobile phone terminal MoPh has a battery 109. Further, although this is not shown in the drawing, the mobile phone terminal has therein a speaker, a microphone and a control key.

<<Bi-Directional Communication Between the Mobile Phone Terminal and a Base Station>>

When RF communication is started by use of the control key, a transmit voice signal from the microphone is converted into a transmit digital baseband signal by treatment by an A/D converter in a baseband processor 100 and modulation by a digital signal processor (DSP) according to a software program. The transmit digital baseband signal is converted into a transmit analog baseband signal by a D/A converter of the RF receive and transmit signals' processing integrated circuit (RFIC) 101. The transmit analog baseband signal is converted into an RF transmit signal by a transmit signal processing unit of RFIC 101. The RF transmit signal is sent to a base station through the RF power amplifier 102 and antenna ANT.

An RF receive signal from a base station, which has been received through the antenna ANT, is converted into a receive analog baseband signal by the receive signal processing unit of RFIC 101. The receive analog baseband signal is converted into a receive digital baseband signal by an A/D converter of RFIC 101. The receive digital baseband signal is converted into a receive voice signal by demodulation by DSP inside the baseband processor 100 according to a software program and a D/A converter. The receive voice signal is supplied to the speaker.

<<NFC Short-Distance Communication by a Mobile Phone Terminal>>

When the mobile phone terminal MoPh shown in FIG. 10 is put within a range of NFC short-distance communication with a non-contact reader/writer apparatus, the mobile phone terminal becomes ready to receive a carrier signal from the non-contact reader/writer apparatus through the coil antenna 107 for NFC communication. The RF circuit 108 for NFC communication responds to a receive carrier signal from the coil antenna 107 for NFC communication to generate an NFC approach notification signal NFC_ApDet. The NFC approach notification signal NFC_ApDet is supplied to the baseband processor 100.

The baseband processor 100 starts a non-contact electronic payment in response to the NFC approach notification signal NFC_ApDet. Also, a contact electronic payment and a non-contact electronic payment by an operation of a non-contact reader/writer can be started following a procedure including: a first step in which the application processor 103 of the mobile phone terminal MoPh generates a non-contact electronic payment start signal NFC_Start according to the setting of the operation mode of the control key or the like; and a second step in which the non-contact electronic payment start signal NFC_Start is supplied to the RF circuit 108 for NFC communication. To start a non-contact electronic payment in response to the NFC approach notification signal NFC_ApDet or start signal NFC_Start, the RF circuit 108 for NFC communication begins bi-directional data communication with the IC-card microcomputer (Secure-Chip) 106, and in parallel, starts supplying an operation clock signal and a source voltage to the IC-card microcomputer 106. Thus, the IC-card microcomputer 106 starts an electronic payment operation.

The source voltage Vdd from the battery 109 of the mobile phone terminal MoPh has been supplied to the baseband processor 100, RF circuit 108 for NFC communication and IC-card microcomputer 106 before start of the electronic payment operation as shown in FIG. 10B. Before start of the electronic payment operation, the IC-card microcomputer 106 supplied with the source voltage Vdd is brought into Standby state (i.e. Sleep state) on the whole. Also, in the baseband processor 100 supplied with the source voltage Vdd, a functional block involved in the electronic payment operation is driven into Standby state. Further, in the RF circuit 108 for NFC communication supplied with the source voltage Vdd, a circuit other than a carrier detector operable to detect the signal level of a receive carrier signal from the coil antenna 107 for NFC communication is put in Standby state before start of the electronic payment operation. Therefore, the carrier detector of the RF circuit 108 for NFC communication is activated even before start of the electronic payment operation, and keeps monitoring the signal level of a receive carrier signal from the coil antenna 107 for NFC communication. The signal level of a receive carrier signal at or above an input threshold voltage of the detection transistor of the carrier detector means that the mobile phone terminal MoPh has gone into a range of NFC short-distance communication with the non-contact reader/writer apparatus. At that time, the RF circuit 108 for NFC communication responds to the receive carrier signal detected by the carrier detector to generate an NFC approach notification signal NFC_ApDet. The NFC approach notification signal NFC_ApDet is supplied to the baseband processor 100. Thus, power supply to the IC-card microcomputer 106 and RF circuit 108 for NFC communication is minimized in Standby state. Specifically, in Standby state, the carrier detector of the RF circuit 108 for NFC communication stops the power supply to the whole IC-card microcomputer 106 and the power supply to a circuit other than the carrier detector of the RF circuit 108 for NFC communication.

<<RF Circuit for NFC Communication and IC-Card Microcomputer>>

Figure 11:
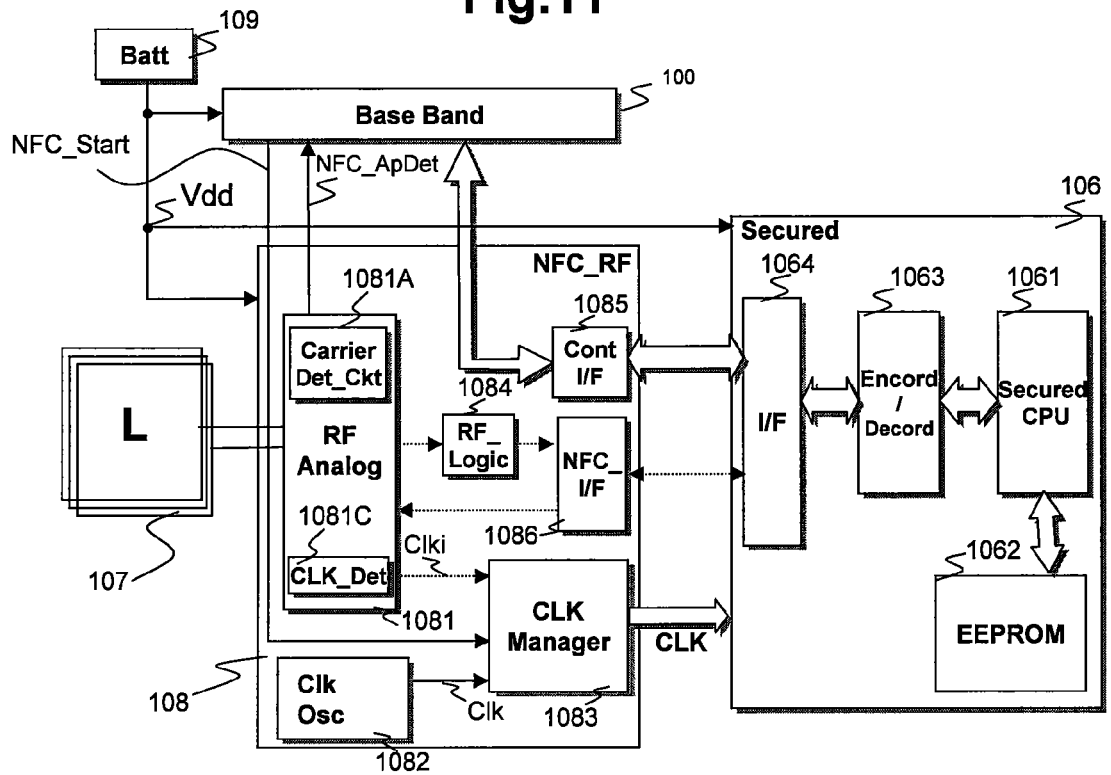
FIG. 11 is a diagram of assistance in explaining an arrangement in connection with the RF circuit for NFC communication and the IC-card microcomputer, which are incorporated in the mobile phone terminal shown in FIGS. 10A and 10B.

FIG. 11 is a diagram of assistance in explaining an arrangement in connection with the RF circuit (RF chip) 108 for NFC communication and the IC-card microcomputer (Secure-Chip) 106, which are incorporated in the mobile phone terminal MoPh shown in FIGS. 10A and 10B.

As shown in FIG. 11, the RF circuit 108 for NFC communication includes an RF analog circuit 1081, a clock oscillator 1082, a clock supply manager (clock supply controller) 1083, an RF logic 1084, a contact communication interface 1085 and an NFC communication interface 1086.

The carrier detector 1081A is composed of a circuit including the detection unit Det_Unit and holding unit Hold_Unit as shown in FIG. 1.

The NFC approach notification signal NFC_ApDet can be generated from the detection output signal OUT shown in FIG. 1. When the signal level of a receive carrier signal from a non-contact reader/writer apparatus reaches or exceeds an input threshold voltage of the carrier detector 1081A, the NFC approach notification signal NFC_ApDet is a signal which is inverted from High level to Low level (approach-detecting state), showing the fact the RF circuit for NFC communication has been put near a non-contact reader/writer apparatus.

The RF analog circuit 1081 is connected with the coil antenna 107 for NFC communication. Therefore, the RF analog circuit 1081 has the function of receiving a carrier signal and an NFC receive data signal from a non-contact reader/writer apparatus, and the function of sending NFC transmit data to a non-contact reader/writer apparatus through the coil antenna 107 for NFC communication. Particularly, the RF analog circuit 1081 includes the carrier detector 1081A for monitoring the signal level of a receive carrier signal from a non-contact reader/writer apparatus, which is received through the coil antenna 107 for NFC communication. Therefore, when the signal level of the receive carrier signal reaches or exceeds the input threshold voltage of the carrier detector 1081A, the RF analog circuit 1081 generates an NFC approach notification signal NFC_ApDet, which is supplied to the baseband processor 100. Also, the RF analog circuit 1081 includes a clock extraction circuit 1081C for extracting a clock out of a receive carrier signal from a non-contact reader/writer apparatus, which is received through the coil antenna 107 for NFC communication. In response to the NFC approach notification signal NFC_ApDet, the clock extraction circuit 1081C starts outputting a carrier extraction clock Clki.

In response to the NFC approach notification signal NFC_ApDet, the baseband processor 100 issues a direction to start an electronic payment operation according to NFC communication to an interface 1064 of the IC-card microcomputer (Secure-Chip) 106 through the contact communication interface 1085 of the RF circuit 108 for NFC communication. Further, in response to the NFC approach notification signal NFC_ApDet, the RF analog circuit 1081 starts supplying the IC-card microcomputer (Secure-Chip) 106 with a NFC receive data signal coming from a non-contact reader/writer apparatus through the RF logic 1084 and NFC communication interface 1086. During this process, the RF logic 1084 performs a digital processing to demodulate the NFC receive data signal from the RF analog circuit 1081 thereby to produce receive data.

Further, the RF circuit 108 for NFC communication makes the clock extraction circuit 1081C start outputting a carrier extraction clock Clki on issue of the NFC approach notification signal NFC_ApDet. Further, the clock supply manager 1083 of the RF circuit 108 for NFC communication starts supplying a clock CLK to the IC-card microcomputer (Secure-Chip) 106 in response to the carrier extraction clock Clki.

Also, the RF circuit 108 for NFC communication makes the clock oscillator 1082 start emitting an internal clock Clk in response to the start signal NFC_Start. Further, in response to the start signal NFC_Start, the clock supply manager 1083 of the RF circuit 108 for NFC communication starts supplying the IC-card microcomputer (Secure-Chip) 106 with a clock CLK depending on the internal clock Clk from the clock oscillator 1082.

The IC-card microcomputer (Secure-Chip) 106 includes a secured-central processing unit 1061, a built-in nonvolatile memory (e.g. EEPROM) 1062, an encoder/decoder 1063 and the interface 1064. When IC-card microcomputer 106 accepts, with the interface 1064, a combination of the direction to start the electronic payment operation according to NFC communication from the baseband processor 100, and supply of the NFC receive data signal from the RF circuit 108 for NFC communication, and supply of the clock CLK from the clock supply manager 1083, the electronic payment operation is started inside the IC-card microcomputer 106. Result-of-payment data of encrypted electronic payment by the secured-central processing unit 1061, built-in nonvolatile memory 1062 and encoder/decoder 1063 are supplied to the NFC communication interface 1086 of the RF circuit 108 for NFC communication through the interface 1064 of the IC-card microcomputer 106. In parallel, the result-of-payment data of encrypted electronic payment are supplied to the baseband processor 100 through the interface 1085 for contact communication.

Transmission of transmit data, which is a result of payment by the IC-card microcomputer 106, from the RF circuit 108 for NFC communication to a non-contact reader/writer apparatus is executed by an RF transmit unit TX of the RF analog circuit 1081 connected with the NFC communication interface 1086 of the RF circuit 108 for NFC communication. The RF transmit unit of the RF analog circuit 1081 executes a transmit operation by which the effective load impedance of the coil antenna 107 for NFC communication is varied according to transmit data sent to the non-contact reader/writer apparatus. As a result, the non-contact reader/writer apparatus for non-contact electronic payment can read out transmit data, which is a result of payment by the IC-card microcomputer 106 incorporated in the mobile phone terminal MoPh, from the variation of the load in association with the coil antenna 107 for NFC communication.

<<Details of the RF Circuit for NFC Communication>>

Figure 12:
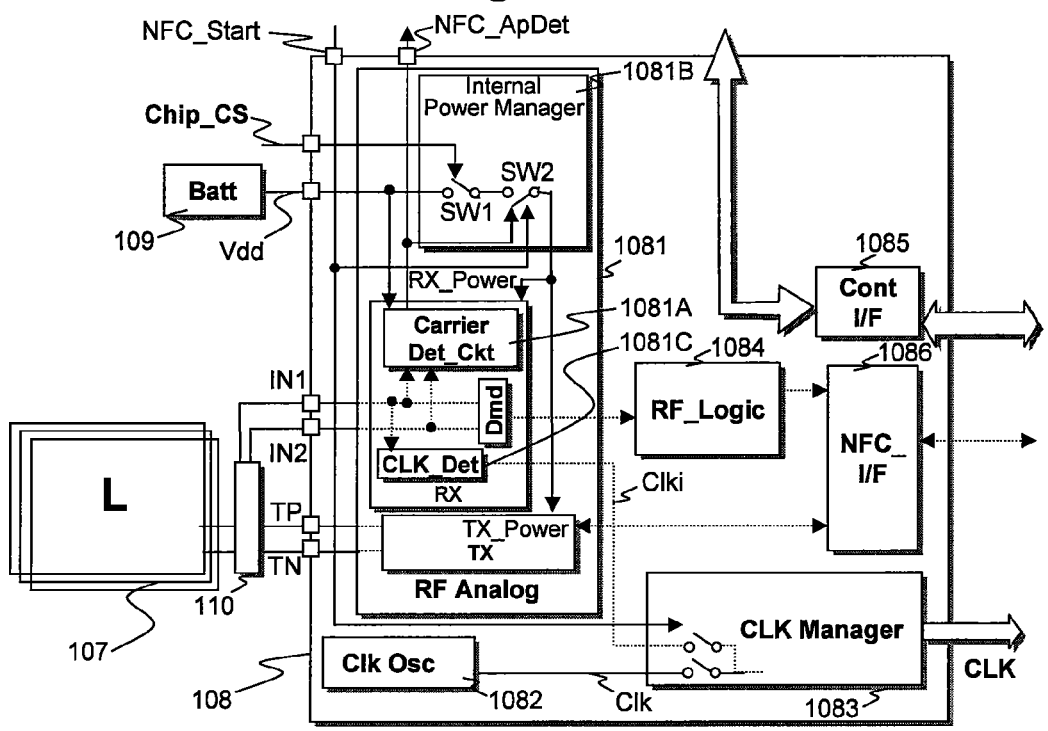
FIG. 12 is a diagram of assistance in explaining a structure of the RF circuit for NFC communication incorporated in the mobile phone terminal MoPh shown in FIG. 11 in detail.

FIG. 12 is a diagram of assistance in explaining a structure of the RF circuit (RF chip) 108 for NFC communication incorporated in the mobile phone terminal MoPh shown in FIG. 11 in detail.

As shown in FIG. 12, the RF analog circuit 1081 of the RF circuit 108 for NFC communication includes a receive unit RX, a transmit unit TX and an internal power manager 1081B. Between the coil antenna 107 for NFC communication and the receive unit RX and transmit unit TX of the RF analog circuit 1081 is connected an impedance matching circuit 110.

Further, between the battery 109 contained in the mobile phone terminal MoPh and the receive unit RX and transmit unit TX of the RF analog circuit 1081 of the RF circuit 108 for NFC communication, a first switch SW1 and a second switch SW2 of the internal power manager 1081B are connected in series. When the first switch SW1 is turned on by a chip control signal Chip_CS supplied through a terminal connectable to the baseband processor 100, and the second switch SW2 is turned on by the NFC approach notification signal NFC_ApDet or non-contact electronic payment start signal NFC_Start supplied through a terminal connectable to the baseband processor 100, data reception by the receive unit RX and data transmission by the transmit unit TX are enabled. In case that the first and second switches SW1 and SW2 connected in series are both in ON state, the source voltage Vdd from the battery 109 of the mobile phone terminal MoPh is supplied to the receive unit RX and transmit unit TX as a receive operation source voltage RX_Power and a transmit operation source voltage TX_Power respectively.

Also, in case that the first switch SW1 and second switch SW2 connected in series are both in OFF state, the source voltage Vdd from the battery 109 of the mobile phone terminal MoPh is constantly supplied to the carrier detector 1081A of the RF analog circuit 1081 of the RF circuit 108 for NFC communication through power source terminals. Accordingly, the carrier detector 1081A can monitor the signal level of a receive carrier signal from a non-contact reader/writer apparatus, which is received through the coil antenna 107 for NFC communication. In this time, in the RF analog circuit 1081 of the RF circuit 108 for NFC communication, the receive unit RX and transmit unit TX except the carrier detector 1081A are not supplied with the source voltage Vdd from the battery 109 of the mobile phone terminal MoPh, and an operation with low power consumption cab be achieved.

The transmit unit TX has a pair of terminals TP and TN connected to the coil antenna 107 for NFC communication through the impedance matching circuit 110. The impedance between the paired terminals TP and TN of the transmit unit TX is varied according to transmit data sent to the non-contact reader/writer apparatus. The transmit operation to transmit data to the non-contact reader/writer apparatus is carried out in this way.

A receive signal from a non-contact reader/writer apparatus, which is received through the coil antenna 107 for NFC communication, is supplied to the receive unit RX of the RF analog circuit 1081 through complementary receive input terminals IN1 and IN2 of the impedance matching circuit 110. The carrier detector 1081A of the receive unit RX monitors the signal level of a receive carrier signal from the non-contact reader/writer apparatus, which has been received through the coil antenna 107 for NFC communication. The demodulator Dmd of the receive unit RX executes e.g. ASK demodulation of data received from the non-contact reader/writer apparatus. The demodulator Dmd removes a 13.56-MHz carrier signal, which is a component of the carrier, from receive carrier signals input through the complementary receive input terminals IN1 and IN2 and performs amplitude modulation (ASK demodulation) thereby to produce rectangular waves of receive data (ASK demodulation data). The ASK demodulation data from the demodulator Dmd is passed to the RF logic 1084. Then, the RF logic 1084 produces data signals of a digital form according to communication protocols of various communication standards, e.g. Type-A, Type-B and Felica (Type-C). Further, the data signals thus produced are supplied to the IC-card microcomputer 106 through the non-contact communication interface (NFC_I/F) 1086, and used in arithmetic processing for an electronic payment operation, etc. Incidentally, ASK is an abbreviation for "Amplitude Shift Keying".

<<Transition of the State of the Mobile Phone Terminal>>

Figure 13:
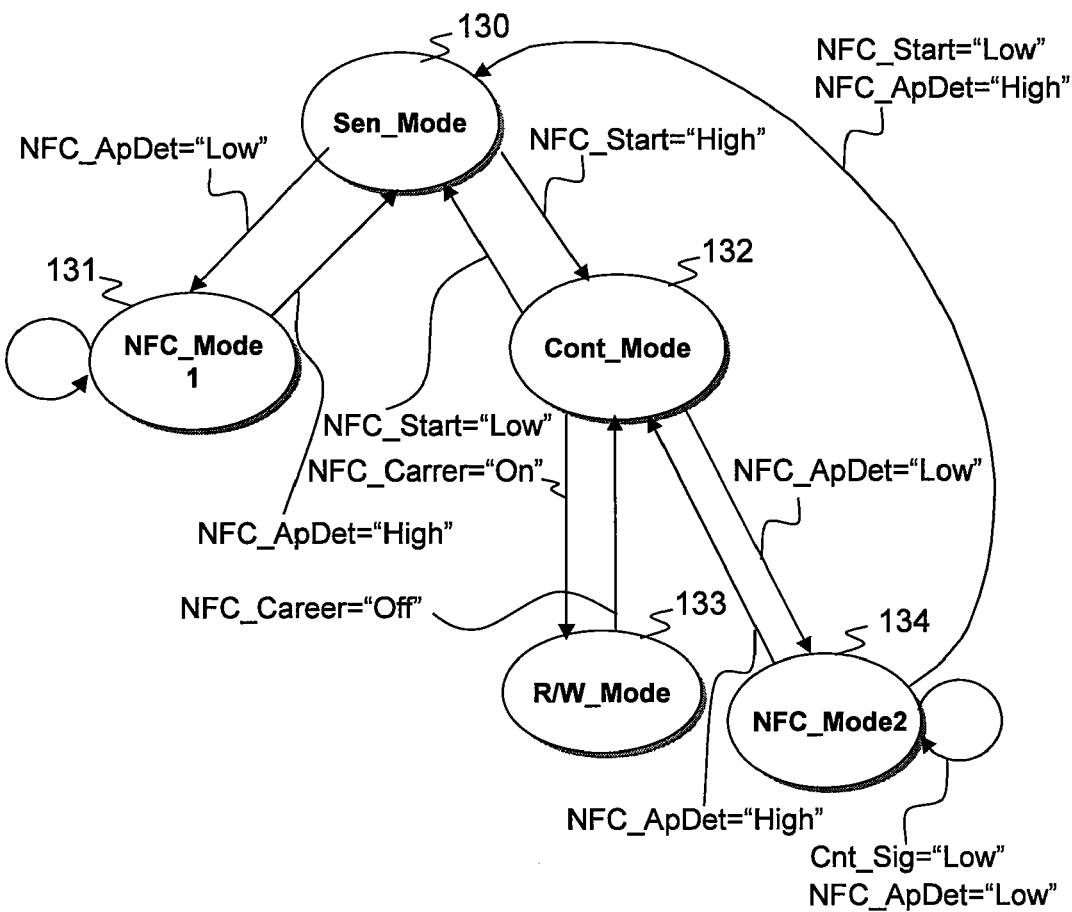
FIG. 13 is a diagram of assistance in explaining the transition of the state of the RF circuit 108 for NFC communication inside the mobile phone terminal shown in FIG. 11 between operation modes.

FIG. 13 is a diagram of assistance in explaining the transition of the state of the RF circuit 108 for NFC communication inside the mobile phone terminal MoPh shown in FIG. 11 between operation modes.

The operation modes include a sensor operation mode (Sen_Mode) 130, an NFC near-distance communication electronic payment operation mode (NFC_Mode1) 131, a contact communication-type electronic payment operation mode (Cont_Mode) 132, a non-contact reader/writer mode (R/W_Mode) 133, and a second non-contact reader/writer mode (NFC_Mode2) 134.

The sensor operation mode 130 is an operation mode such that the signal level of a receive carrier signal from a non-contact reader/writer apparatus is monitored by the carrier detector 1081A of the RF circuit 108 for NFC communication, however no power is supplied to other internal circuits of the RF circuit 108 for NFC communication.

The NFC near-distance communication electronic payment operation mode 131 is an operation mode after the mobile phone terminal MoPh is put within a range of NFC short-distance communication with a non-contact reader/writer apparatus. Therefore, the power is supplied to the inside of the RF circuit 108 for NFC communication. Further, in this mode, the receive unit RX receives a carrier signal and an NFC data signal from the non-contact reader/writer apparatus, and the transmit unit TX sends the NFC data signal to the non-contact reader/writer apparatus through the coil antenna 107 for NFC communication according to the transmit operation by which the effective load impedance is changed. The NFC data signal received is to undergo arithmetic processing by e.g. the secured-central processing unit 1061 incorporated in the IC-card microcomputer 106 or an arithmetic processing section incorporated in the baseband processor 100. From a result of this arithmetic processing, the transmit unit TX generates an NFC data signal to be sent to the non-contact reader/writer apparatus.

The contact communication-type electronic payment operation mode 132 is an operation mode which can be set by operation mode setting by the application processor 103 of the mobile phone terminal MoPh, the control key or the like. In this contact communication-type electronic payment operation mode 132, the power is supplied to the inside of the RF circuit 108 for NFC communication, and an operation for contact communication-type electronic payment is performed with the baseband processor 100 through the contact communication interface 1085.

The non-contact reader/writer mode 133 is an operation mode in association with a non-contact reader/writer after the transition from the contact communication-type electronic payment operation mode 132 according to a direction by the application processor 103. Also, after the transition, the power remains supplied to the inside of the RF circuit 108 for NFC communication continuously, and the carrier signal and NFC data signal can be sent to the non-contact IC-card, which is placed outside, through the coil antenna 107 for NFC communication. However, in the non-contact reader/writer mode 133, an NFC data signal transmitted from a non-contact IC-card can be received as a fluctuation in load of the coil antenna 107 for NFC communication.

The second non-contact reader/writer mode 134 is an operation mode which the mobile phone terminal transitions to when a carrier signal from a non-contact reader/writer apparatus is sensed after transition to the contact communication-type electronic payment operation mode 132, in which an operation for NFC near-distance communication electronic payment is performed. Also, after the transition, the power is supplied to the inside of the RF circuit 108 for NFC communication continuously. The RF circuit can receive a carrier signal and an NFC data signal from a non-contact reader/writer apparatus, and can send NFC data to the non-contact reader/writer apparatus through the coil antenna 107 for NFC communication according to the transmit operation by which the effective load impedance is changed.

The embodiment is applicable to data transfer operations of the RF circuit 108 for NFC communication and IC-card microcomputer (Secure-Chip) 106 particularly in the NFC near-distance communication electronic payment operation mode 131 and the second non-contact reader/writer mode 134.

In case of the mobile phone terminal MoPh shown in FIG. 11, the first operation mode is set to the sensor operation mode 130. In the sensor operation mode 130, the carrier detector 1081A of the RF analog circuit 1081 of the RF circuit 108 for NFC communication incorporated in the mobile phone terminal MoPh shown in FIG. 11 monitors the signal level of a receive carrier signal from a non-contact reader/writer apparatus, which has been received through the coil antenna 107 for NFC communication.

When the mobile phone terminal MoPh is put within a range of NFC near-distance communication with the non-contact reader/writer apparatus, the amplitude of a receive carrier signal from a non-contact reader/writer apparatus becomes High level. As shown in FIG. 2, in case that a receive carrier signal from a non-contact reader/writer apparatus has an amplitude of High level, the detection output signal OUT of the carrier detector 1081A is made Low level. Hence, the NFC approach notification signal NFC_ApDet of Low level is supplied to the baseband processor 100 (see FIG. 11 or 12). Therefore, to enable electronic payment through NFC near-distance communication, the state of the mobile phone terminal MoPh is made to transition from the sensor operation mode 130 to the NFC near-distance communication electronic payment operation mode 131.

When the mobile phone terminal MoPh is moved out of the range of NFC near-distance communication with a non-contact reader/writer apparatus after completion of processing for electronic payment, the amplitude of a receive carrier signal from the non-contact reader/writer apparatus is made Low level. As a result, the NFC approach notification signal NFC_ApDet is made High level, and the state of the mobile phone terminal MoPh is returned from the NFC near-distance communication electronic payment operation mode 131 back to the sensor operation mode 130.

On the other hand, in case that the control signal NFC_Start of High level "1" is set by operation mode setting by the application processor 103, the control key or the like, the control signal NFC_Start of High level "1" functions as a disable signal which makes non-contact electronic payment impossible. In this case, the state of the mobile phone terminal MoPh is made to transition from the sensor operation mode 130 to the contact communication-type electronic payment operation mode 132. Contact communication-type electronic payment in the contact communication-type electronic payment operation mode 132 is enabled by connecting the mobile phone terminal MoPh to a personal computer (PC) through a standard external connection cable, such as a USB connection cable. Incidentally, USB is an abbreviation for "Universal Serial Bus".

In this case, when a write request or a read request on the mobile phone terminal MoPh is issued in the non-contact reader/writer mode, the carrier signal NFC_Carrier supplied from the baseband processor 100 is output, and the state of the mobile phone terminal MoPh is made to transition from the contact communication-type electronic payment operation mode 132 to the non-contact reader/writer mode 133.

However, in some cases, after transition to the contact communication-type electronic payment operation mode 132, neither the write request nor read request is issued, and a carrier signal and transmit data are sent from a non-contact reader/writer apparatus for NFC near-distance communication electronic payment, which is incorporated in a personal computer (PC). In such cases, the NFC approach notification signal NFC_ApDet is at Low level "0", and the state of the mobile phone terminal MoPh is shifted from the contact communication-type electronic payment operation mode 132 to the second NFC near-distance communication electronic payment operation mode 134.

<<Operation Waveform of the RF Circuit for NFC Communication>>

Figure 14:
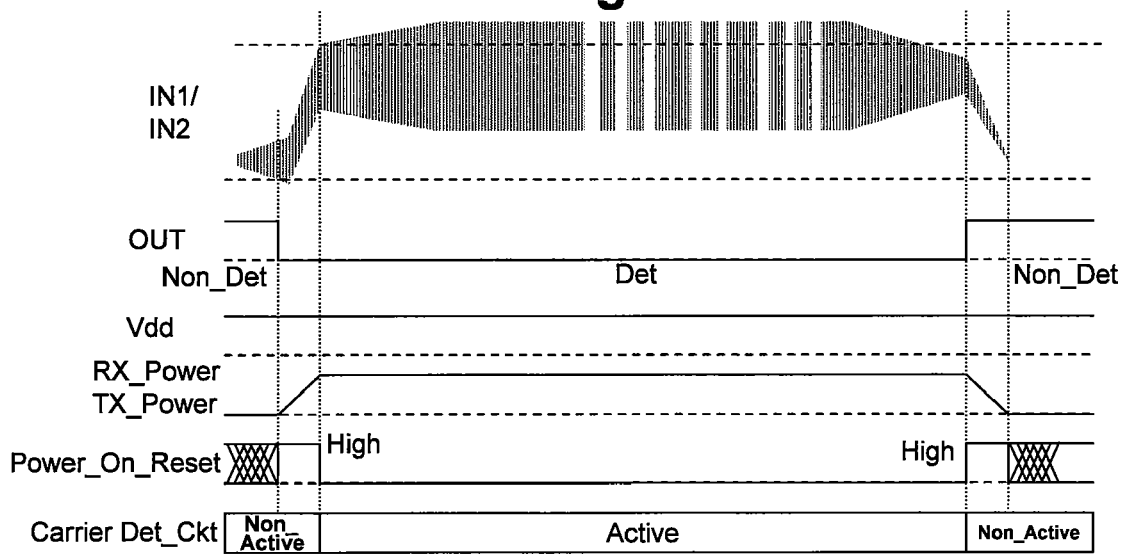
FIG. 14 is a diagram of assistance in explaining operation waveforms at parts in the RF circuit for NFC communication shown in FIG. 12.

FIG. 14 is a diagram of assistance in explaining operation waveforms at parts in the RF circuit (RF chip) 108 for NFC communication shown in FIG. 12.

The top portion of FIG. 14 shows a receive carrier signal at the complementary receive input terminals IN1 and IN2 of the receive unit RX of the RF analog circuit 1081. When the amplitude of the receive carrier signal is made High level, the detection output signal OUT at the carrier detector 1081A is made Low level as shown in the second portion below it.

On the other hand, the source voltage Vdd from the battery 109 of the mobile phone terminal MoPh is kept substantially at a constant level. However, only in a period during which the detection output signal OUT is at Low level, the receive operation source voltage RX_Power and transmit operation source voltage TX_Power of a predetermined voltage level are supplied to the receive unit RX and the transmit unit TX respectively. In case that the operation source voltages RX_Power and TX_Power are changed from Low to High level, a power-on-reset signal Power_OnReset of High level is produced. Now, it is noted that the power supply can be started by the signal NFC_Start as described with reference to FIG. 13.

The power-on-reset signal Power_OnReset of High level is supplied to the RF logic 1084, contact communication interface 1085 and NFC communication interface 1086 of the RF circuit 108 for NFC communication, whereby initialization processes of these circuits are carried out.

Further, only in a period during which the receive carrier signal has an amplitude of High level, two detection MOS transistors of the carrier detector 1081A are made conductive, while the two detection MOS transistors are both made non-conductive in a period during which the carrier signal has an amplitude of Low level. Therefore, power consumption owing to monitoring of the level of the receive carrier signal can be reduced.

Other Embodiments

Figure 15:
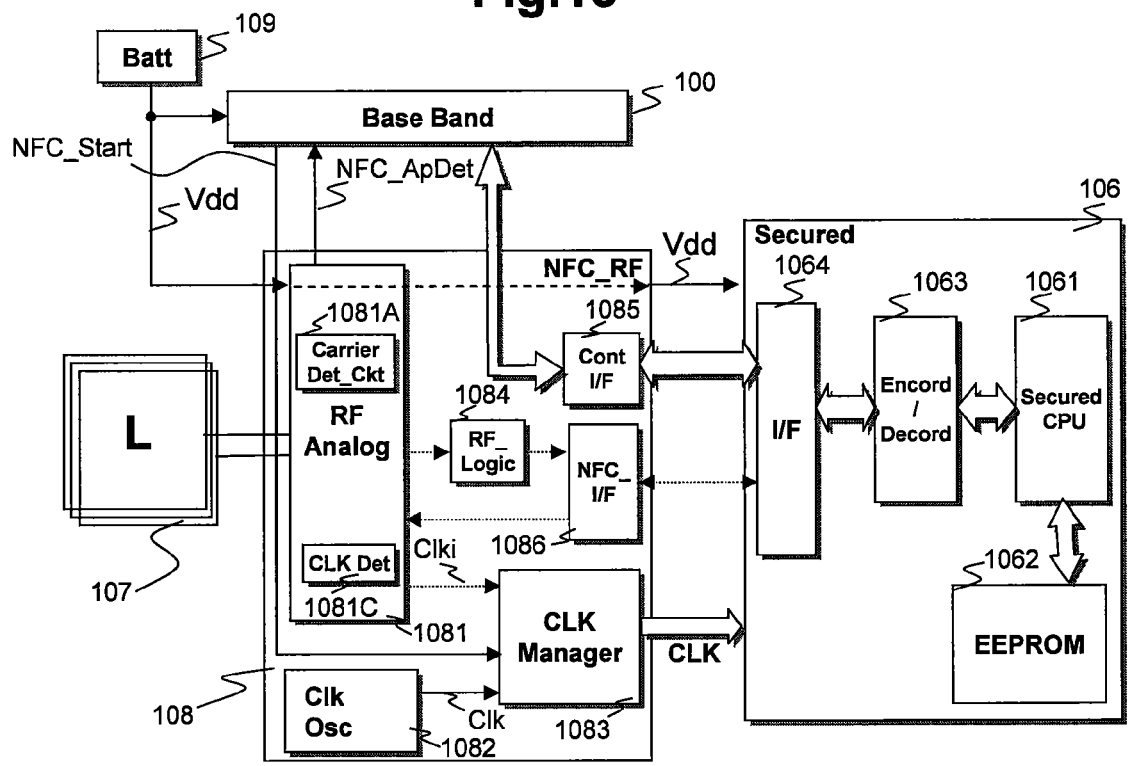
FIG. 15 is a diagram of assistance in explaining another arrangement in connection with the RF circuit for NFC communication and the IC-card microcomputer, which are incorporated in the mobile phone terminal shown in FIGS. 10A and 10B.

FIG. 15 is a diagram of assistance in explaining another arrangement in connection with RF circuit (RF chip) 108 for NFC communication and the IC-card microcomputer (Secure-Chip) 106, which are incorporated in the mobile phone terminal MoPh shown in FIGS. 10A and 10B.

The arrangement in connection with RF circuit 108 and IC-card microcomputer 106 shown in FIG. 15 differs from the arrangement shown in FIG. 11 in that the source voltage Vdd supplied from the battery 109 to the IC-card microcomputer 106 is passed through the RF circuit 108 for NFC communication. However, other things are common to these embodiments.

Figure 16:
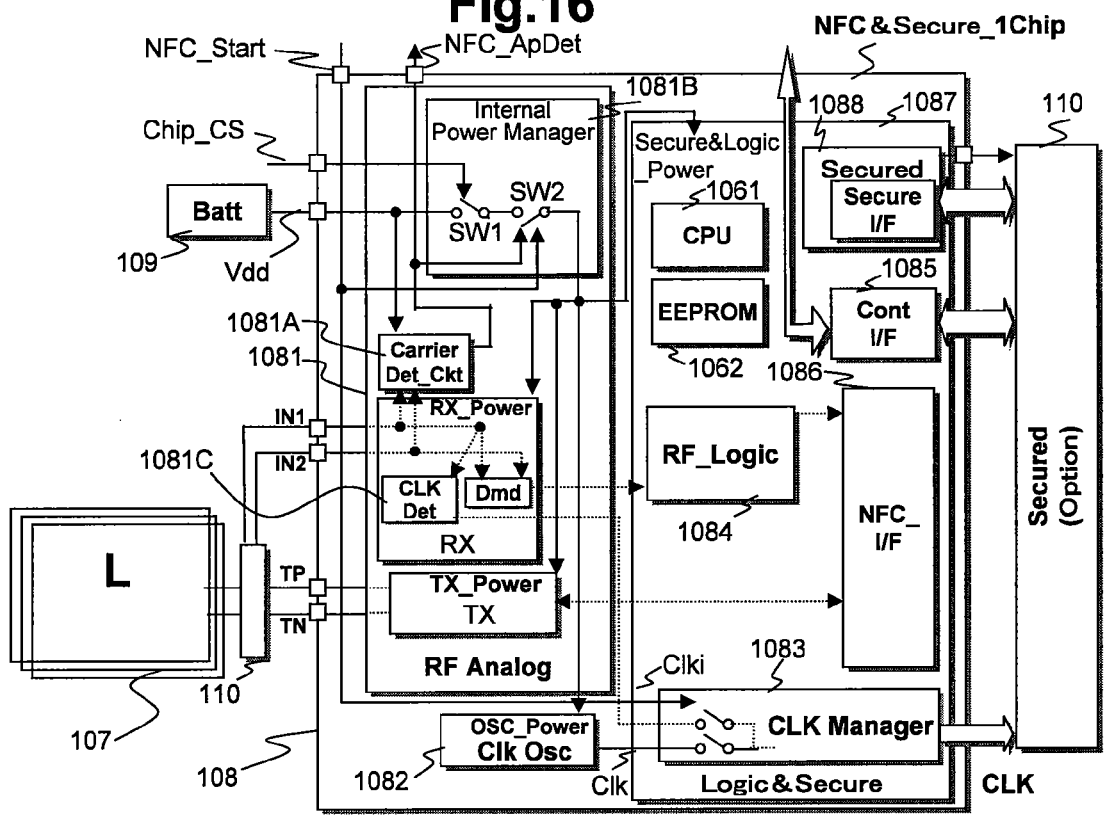
FIG. 16 is a diagram of assistance in explaining another structure of the RF circuit for NFC communication incorporated in the mobile phone terminal shown in FIG. 11 in detail.

FIG. 16 is a diagram of assistance in explaining another structure of RF circuit (RF chip) 108 for NFC communication incorporated in the mobile phone terminal MoPh shown in FIG. 11 in detail.

The RF circuit 108 (a NFC & Secure chip which is formed on a semiconductor integrated circuit) shown in FIG. 16 differs from that shown in FIG. 12 in that a secure block 1087 is laid out on the right of the RF circuit 108 for NFC communication of FIG. 16, and the secure block 1087 includes the secured-central processing unit 1061 and internal nonvolatile memory 1062 of the IC-card microcomputer 106 as shown in FIG. 11. Outside the secure block 1087, another Secure-Chip 110 may be connected through an external bus or two or more terminals. Further, the secure block 1087 has therein a clock supply manager 1083, an RF logic 1084, a contact communication interface 1085, an NFC communication interface 1086 and a secure processing unit 1088. Incidentally, the secure processing unit 1088 includes a secure interface to which the Secure-Chip 110 can be connected from the outside.

While the invention made by the inventors has been specifically described above based on the embodiments, the invention is not so limited. It is needless to say that various modifications and changes may be made without departing from the subject matter hereof.

For example, as to the detection unit Det_Unit of the carrier detector shown in FIG. 1, it is possible to replace the first and second detection transistors M1 and M2 of N channel with P-channel MOS transistors, and replace the load transistor M3 and amplifier transistor M4 of P channel with N-channel MOS transistors. Thus, a combination of the first and second detection transistors M1 and M2 of P channel of the carrier detector works as a Class-B push-push full-wave rectification detector of low power consumption.

Further, with the detection unit Det_Unit of the carrier detector of FIG. 1, the first and second detection transistors M1 and M2 may be composed of NPN bipolar transistors, and the load transistor M3 and amplifier transistor M4 may be composed of PNP bipolar transistors.

Still further, the detection unit Det_Unit of the carrier detector of FIG. 1 may take a form of a half-wave rectification detector. However, with such form, the detection efficiency is lowered. In case that the detection unit Det_Unit of the carrier detector of FIG. 1 is changed in form to a half-wave rectification detector, e.g. the second MOS transistor M2 of the detection unit Det_Unit is omitted. The diode-connected MOS transistor M6 to prevent countercurrent can be also omitted because the transistor M6 is made unnecessary by omitting the second MOS transistor M2. This, the chip area can be reduced by decreasing the MOS transistors.

The system which incorporates the antenna ANT, RFIC 101, RF power amplifier 102, baseband processor 100, application processor 103, coil antenna 107 for NFC communication and RF circuit 108 for NFC communication is not limited to a mobile phone terminal. That is, the invention can be applied to a PDA device which contains them.

In addition, the baseband processor 100 and the application processor 103 may be integrated into different semiconductor chips (semiconductor ICs), or may be integrated into an integrated one-chip (one-chip LSI). Further, the RFIC 101, RF power amplifier 102 and IC-card microcomputer 106 may be integrated into the integrated one-chip.

The invention is not limited to electronic payment according to NFC near-distance communication, and it can be also applied to electronic payment according to another near-distance communication system such as PICC. Incidentally, PICC is an abbreviation for "Proximity IC Card" meaning a non-contact IC-card.

What is claimed is:

1. A detector comprising:
a first input terminal;
a second input terminal;
a first transistor;
a second transistor; and
a load element,
wherein the first and second input terminals can be supplied with complementary input signals reverse to each other in phase,
the first and second transistors each include first and second input electrodes and an output electrode, and the first and second transistors emit output currents from the output electrodes in response to supply of an input voltage having a predetermined polarity and a predetermined voltage level to the first and second input electrodes,
the first input terminal is connected to the first input electrode of the first transistor and the second input electrode of the second transistor, and the second input terminal is connected to the second input electrode of the first transistor and the first input electrode of the second transistor,
the load element is connected between the output electrodes of the first and second transistors and an operating voltage point,
the first transistor is larger in degree of conduction than the second transistor in a first cycle where a voltage of the second input terminal shows one of positive and negative polarities with respect to a voltage of the first input terminal,
the second transistor is larger in degree of conduction than the first transistor in a second cycle where the voltage of the second input terminal shows the other polarity with respect to the voltage of the first input terminal, and
a detection voltage resulting from full-wave rectification arises from a circuit node to which the output electrodes of the first and second transistors and the load element are connected.

2. The detector according to claim 1 further comprising: a first element for preventing countercurrent connected between the circuit node and the output electrode of the first transistor; and
a second element for preventing countercurrent between the circuit node and the output electrode of the second transistor.

3. The detector according to claim 2, further comprising:
a first resistance for preventing electrostatic destruction connected between the first input terminal and the first input electrode of the first transistor; and
a second resistance for preventing electrostatic destruction connected between the second input terminal and the first input electrode of the second transistor.

4. The detector according to claim 2, further comprising an amplifier transistor having a first input electrode connected to the circuit node and a second input electrode connected to the operating voltage point,
wherein an inverted and amplified detection voltage arises from an output electrode of the amplifier transistor.

5. The detector according to claim 4, further comprising:
a parallel-connected combination composed of a holding capacitance and an element for preparing a discharge time constant and connected between the output electrode of the amplifier transistor and an operating voltage point; and
an output circuit with an input terminal connected to the output electrode of the amplifier transistor,
wherein the output circuit has a predetermined input threshold voltage, and the output circuit judges a voltage level of the inverted and amplified detection voltage based on the input threshold voltage.

6. The detector according to claim 5, wherein the first and second transistors, and first and second elements for preventing countercurrent are N-channel MOS transistors, and
the load element and amplifier transistor are P-channel MOS transistors.

7. An RF circuit electrically connectable with a processor having a data-processing function and a microcomputer having an encrypted electronic payment function, comprising:
an antenna; and
a detector for detecting a receive signal from a non-contact reader/writer apparatus, which has been received through the antenna,
wherein the detector monitors a signal level of the receive signal from the non-contact reader/writer apparatus, which has been received through the antenna,
the detector generates a detected signal in response to the signal level equal to or over a predetermined threshold, and supplies the detected signal to the processor,
the processor generates a start signal in response to the detected signal and supplies the start signal to the RF circuit,
the RF circuit starts supplying an operation clock to the microcomputer in response to the start signal, whereby an encrypted electronic payment operation by the microcomputer is started,
payment transmit data resulting from the encrypted electronic payment operation is supplied to the RF circuit through electrical connection with the microcomputer,
the RF circuit includes an RF transmit unit for sending the payment transmit data to the non-contact reader/writer apparatus through the antenna, the detector includes a first input terminal, a second input terminal, a first transistor, a second transistor and a load element, the first and second input terminals can be supplied with complementary input signals reverse to each other in phase, the first and second transistors each include first and second input electrodes and an output electrode, the first and second transistors emit output currents from the output electrodes in response to supply of an input voltage having a predetermined polarity and a predetermined voltage level to the first and second input electrodes, the first input terminal is connected to the first input electrode of the first transistor and the second input electrode of the second transistor, and the second input terminal is connected to the second input electrode of the first transistor and the first input electrode of the second transistor, the load element is connected between the output electrodes of the first and second transistors and an operating voltage point, the first transistor is larger in degree of conduction than the second transistor in a first cycle where a voltage of the second input terminal shows one of positive and negative polarities with respect to a voltage of the first input terminal, the second transistor is larger in degree of conduction than the first transistor in a second cycle where the voltage of the second input terminal shows the other polarity with respect to the voltage of the first input terminal, and a detection voltage resulting from full-wave rectification arises from a circuit node to which the output electrodes of the first and second transistors and the load element are connected.

8. The RF circuit according to claim 7, wherein the processor includes at least one of a baseband processor and an application processor for transmission and reception between a mobile phone terminal and a base station.

9. The RF circuit according to claim 8, further comprising:
a first element for preventing countercurrent connected between the circuit node and the output electrode of the first transistor;
a second element for preventing countercurrent between the circuit node and the output electrode of the second transistor;
a first resistance for preventing electrostatic destruction connected between the first input terminal and the first input electrode of the first transistor; and
a second resistance for preventing electrostatic destruction connected between the second input terminal and the first input electrode of the second transistor.

10. The RF circuit according to claim 9, further comprising an amplifier transistor having a first input electrode connected to the circuit node and a second input electrode connected to the operating voltage point,
wherein an inverted and amplified detection voltage arises from an output electrode of the amplifier transistor.

11. The RF circuit according to claim 10, further comprising:
a parallel-connected combination composed of a holding capacitance and an element for preparing a discharge time constant and connected between the output electrode of the amplifier transistor and an operating voltage point; and
an output circuit with an input terminal connected to the output electrode of the amplifier transistor,
wherein the output circuit has a predetermined input threshold voltage, and the output circuit judges a voltage level of the inverted and amplified detection voltage based on the input threshold voltage.

12. The RF circuit according to claim 11, wherein the first and second transistors, and first and second elements for preventing countercurrent are N-channel MOS transistors, and
the load element and amplifier transistor are P-channel MOS transistors.

13. A mobile device, comprising:
a battery;
a processor;
a microcomputer;
an antenna; and
an RF circuit, all of which can be incorporated in the device,
wherein the battery supplies a source voltage to the processor, microcomputer and RF circuit,
the processor has a data-processing function, and the microcomputer has an encrypted electronic payment function,
the antenna is used to receive a receive signal from a non-contact reader/writer apparatus, send a transmit signal to the apparatus, and the RF circuit is supplied with the receive signal, and generates the transmit signal,
the RF circuit can be electrically connected to the processor and microcomputer,
the RF circuit includes a detector for detecting the receive signal from the non-contact reader/writer apparatus, which has been received through the antenna,
the detector monitors a signal level of the receive signal from the non-contact reader/writer apparatus, which has been received through the antenna,
the detector generates a detected signal in response to the signal level equal to or over a predetermined threshold, and supplies the detected signal to the processor,
the processor generates a start signal in response to the detected signal, and supplies the start signal to the RF circuit,
the RF circuit starts supplying an operation clock to the microcomputer in response to the start signal, whereby an encrypted electronic payment operation by the microcomputer is started,
payment transmit data resulting from the encrypted electronic payment operation is supplied to the RF circuit through electrical connection with the microcomputer,
the RF circuit includes an RF transmit unit for sending the payment transmit data to the non-contact reader/writer apparatus through the antenna,
the detector includes a first input terminal, a second input terminal, a first transistor, a second transistor and a load element,
the first and second input terminals can be supplied with complementary input signals reverse to each other in phase,
the first and second transistors each include first and second input electrodes and an output electrode,
the first and second transistors emit output currents from the output electrodes in response to supply of an input voltage having a predetermined polarity and a predetermined voltage level to the first and second input electrodes,
the first input terminal is connected to the first input electrode of the first transistor and the second input electrode of the second transistor, and the second input terminal is connected to the second input electrode of the first transistor and the first input electrode of the second transistor,
the load element is connected between the output electrodes of the first and second transistors and an operating voltage point, the first transistor is larger in degree of conduction than the second transistor in a first cycle where a voltage of the second input terminal shows one of positive and negative polarities with respect to a voltage of the first input terminal, the second transistor is larger in degree of conduction than the first transistor in a second cycle where the voltage of the second input terminal shows the other polarity with respect to the voltage of the first input terminal, and a detection voltage resulting from full-wave rectification arises from a circuit node to which the output electrodes of the first and second transistors and the load element are connected.

14. The mobile device according to claim 13, wherein the processor includes at least one of a baseband processor and an application processor for transmission and reception between a mobile phone terminal and a base station.

15. The mobile device according to claim 14, further comprising:
a first element for preventing countercurrent connected between the circuit node and the output electrode of the first transistor;
a second element for preventing countercurrent between the circuit node and the output electrode of the second transistor;
a first resistance for preventing electrostatic destruction connected between the first input terminal and the first input electrode of the first transistor; and
a second resistance for preventing electrostatic destruction connected between the second input terminal and the first input electrode of the second transistor.

16. The mobile device according to claim 15, further comprising an amplifier transistor having a first input electrode connected to the circuit node and a second input electrode connected to the operating voltage point,
wherein an inverted and amplified detection voltage arises from an output electrode of the amplifier transistor.

17. The mobile device according to claim 16, further comprising:
a parallel-connected combination composed of a holding capacitance and an element for preparing a discharge time constant and connected between the output electrode of the amplifier transistor and an operating voltage point; and
an output circuit with an input terminal connected to the output electrode of the amplifier transistor,
wherein the output circuit has a predetermined input threshold voltage, and the output circuit judges a voltage level of the inverted and amplified detection voltage based on the input threshold voltage.

18. The mobile device according to claim 17, wherein the first and second transistors, and first and second elements for preventing countercurrent are N-channel MOS transistors, and
the load element and amplifier transistor are P-channel MOS transistors.

19. A detector comprising at least:
a first input terminal;
a second input terminal;
a transistor; and
a load element,
wherein the first and second input terminals can be connected with two opposing ends of an antenna respectively,
the first and second input terminals can be supplied with complementary input signals reverse to each other in phase at the opposing ends of the antenna,
the transistor includes first and second input electrodes and an output electrode,
the transistor emits output current from the output electrode in response to supply of an input voltage having a predetermined polarity and a predetermined voltage level to the first and second input electrodes,
the first input terminal is connected to the first input electrode of the transistor, and the second input terminal is connected to the second input terminal of the transistor,
the load element is connected between the output electrode of the transistor and an operating voltage point,
a degree of conduction of the transistor rises in a first cycle where a voltage of the second input terminal shows one of positive and negative polarities with respect to a voltage of the first input terminal, and the degree of conduction of the transistor lowers in a second cycle where the voltage of the second input terminal shows the other polarity with respect to the voltage of the first input terminal, and
a detection voltage resulting from rectification arises from a circuit node connected to the output electrode of the transistor and the load element.

20. The detector according to claim 19, further comprising a resistance for preventing electrostatic destruction connected between the first input terminal and the first input electrode of the transistor.

21. The detector according to claim 19, further comprising an amplifier transistor having a first input electrode connected to the circuit node and a second input electrode connected to the operating voltage point,
wherein an inverted and amplified detection voltage arises from an output electrode of the amplifier transistor.

22. The detector according to claim 21, further comprising:
a parallel-connected combination composed of a holding capacitance and an element for preparing a discharge time constant and connected between the output electrode of the amplifier transistor and an operating voltage point; and
an output circuit with an input terminal connected to the output electrode of the amplifier transistor,
wherein the output circuit has a predetermined input threshold voltage, and the output circuit judges a voltage level of the inverted and amplified detection voltage based on the input threshold voltage.

23. The detector according to claim 22, wherein the transistor is an N-channel MOS transistor,
the load element and amplifier transistor are P-channel MOS transistors.

* * * * *